United States Patent
Cho et al.

(10) Patent No.: US 8,106,464 B2
(45) Date of Patent: Jan. 31, 2012

(54) SEMICONDUCTOR DEVICE HAVING BAR TYPE ACTIVE PATTERN

(75) Inventors: Keun-hwl Cho, Seoul (KR); Dong-won Kim, Seongnam-si (KR); Jun Seo, Asan-si (KR); Min-sang Kim, Seoul (KR); Sung-min Kim, Incheon (KR); Hyun-jun Bae, Suwon-si (KR); Ji-Myoung Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 128 days.

(21) Appl. No.: 12/461,500

(22) Filed: Aug. 13, 2009

(65) Prior Publication Data

US 2010/0059807 A1    Mar. 11, 2010

(30) Foreign Application Priority Data

Sep. 5, 2008 (KR) .......................... 10-2008-0087860

(51) Int. Cl.
*H01L 27/088* (2006.01)

(52) U.S. Cl. .......... 257/401; 257/E29.273; 257/E29.298

(58) Field of Classification Search .................. 257/331, 257/401, E29.274
See application file for complete search history.

(56) References Cited

U.S. PATENT DOCUMENTS

| | | | | |
|---|---|---|---|---|
| 5,578,518 | A * | 11/1996 | Koike et al. | 438/424 |
| 6,787,854 | B1 | 9/2004 | Yang et al. | |
| 2004/0262690 | A1* | 12/2004 | Coronel et al. | 257/365 |
| 2005/0023619 | A1* | 2/2005 | Orlowski et al. | 257/401 |
| 2005/0158934 | A1* | 7/2005 | Yun et al. | 438/197 |
| 2005/0266645 | A1* | 12/2005 | Park | 438/282 |

FOREIGN PATENT DOCUMENTS

| KR | 10-2006-00027493 | 3/2006 |
|---|---|---|
| KR | 10-0594327 | 6/2006 |

OTHER PUBLICATIONS

Kikuo Yamabe, Nonplanar Oxidation and Reduction of Oxide Leakage currents at Silicon Corners by Rounding-off Oxidation, Aug. 1987, IEEE Transactions on Electron Devices, vol. ED-34, No. 8, pp. 1681-1686.*

* cited by examiner

*Primary Examiner* — Jerome Jackson, Jr.
*Assistant Examiner* — Paul Budd
(74) *Attorney, Agent, or Firm* — Harness, Dickey & Pierce, P.L.C.

(57) ABSTRACT

A semiconductor device having a bar type active pattern and a method of manufacturing the same are provided. The semiconductor device may include a semiconductor substrate having a semiconductor fin configured to protrude from a surface of the semiconductor substrate in a first direction, the semiconductor substrate having a first width and a second width crossing the first width, wherein the first width and the second width extend in a second direction. A plurality of active patterns may be arranged in the first direction with a separation gap from the semiconductor fin. A plurality of support patterns may be arranged between the semiconductor fin and one of the plurality of active patterns arranged closer to the semiconductor fin in the first direction, and between the plurality of active patterns arranged in the first direction to support the plurality of active patterns. A gate may be arranged to cross the plurality of active patterns in the second direction and to cover a portion of the at least one of the plurality of active patterns.

15 Claims, 27 Drawing Sheets

SEMICONDUCTOR DEVICE HAVING BAR TYPE ACTIVE PATTERN

PRIORITY STATEMENT

This application claims priority under 35 U.S.C. §119 to Korean Patent Application No. 10-2008-0087860, filed on Sep. 5, 2008, in the Korean Intellectual Property Office (KIPO), the entire contents of which are incorporated herein by reference.

BACKGROUND

1. Field

Example embodiments relate to a semiconductor device, and more particularly, to a semiconductor device having a bar type active pattern.

2. Description of the Related Art

Along with the development of semiconductor devices towards high speed, high performance and low power consumption, ongoing efforts have been made to increase the density of an integrated circuit (IC) with smaller transistors while maintaining the improved driving performance of the transistors constituting the IC. For a higher device density, transistors with a smaller feature size and a 3-dimensional structure are drawing more attention. Transistors that may be manufactured to be smaller and may improve the performance of devices include MOS transistors with a fin structure, a fully Depleted Lean-channel TrAnsistor (DELTA) structure, and a Gate All Around (GAA) structure.

Because transistors with a GAA gate structure are manufactured using damascene processes, the manufacturing process is complicated and the manufacturing cost rises. In addition, in order to prevent or reduce lifting of an active pattern, either a damascene stack or an "H"-shaped active pattern with a channel region whose width is much smaller than the widths of source and drain regions has been formed. Transistors with such a GAA structure are disadvantageous in terms of higher-density integration because these transistors require an additional process, complicate the manufacturing process itself, and have a limit in reducing the size of devices.

SUMMARY

Example embodiments provide a semiconductor device with a bar type active pattern.

According to example embodiments, a semiconductor device may include a semiconductor substrate including a semiconductor fin configured to protrude from a surface of the semiconductor substrate in a first direction, the semiconductor fin having a first width and a second width crossing the first width, wherein the first width and the second width extend in a second direction. A plurality of active patterns may be arranged in the first direction with a separation gap from the semiconductor fin. A plurality of support patterns may be arranged between the semiconductor fin and one of the plurality of active patterns arranged in the first direction, and between the plurality of active patterns arranged in the first direction to support the plurality of active patterns. A gate may be arranged to cross the plurality of active patterns in the second direction and to cover a portion of at least one of the plurality of active patterns.

The plurality of active patterns may be bar type semiconductor patterns configured to extend in the second direction and may have a cross-section with rounded edges. The plurality of active patterns may be monocrystalline silicon patterns. The plurality of support patterns may be silicon-germanium-oxide layer patterns.

The gate may have an omega-like shape configured to cover in the second direction either at least one of the plurality of active patterns or at least one of the plurality of active patterns and a portion of one of the plurality of support patterns that supports the plurality of active patterns. The gate may have a gate all around (GAA) structure configured to cover in the second direction the plurality of active patterns, the plurality of support patterns supporting the plurality of active patterns, and a portion of the semiconductor fin.

Source regions and drain regions may be further arranged in portions of the active patterns and the semiconductor fin that are on both sides of the gate and exposed from the gate, and multiple channel regions may be arranged between the source regions and drain regions. Widths of the source and drain regions may be substantially equal to widths of the multiple channel regions in the direction of the first width.

The semiconductor substrate may further include a trench on the surface of the semiconductor substrate to define the semiconductor fin. A first insulation layer may fill a portion of the trench and expose at least the exposed portion of the semiconductor fin. A second insulation layer may be formed on the first insulation layer to cover the gate, the plurality of active patterns, the exposed portion of the semiconductor fin and the plurality of support patterns, the second insulation layer including a contact that exposes portions of the plurality of active patterns and the semiconductor fin that include ones of the source regions and drain regions. A conductive plug may fill the contact and completely cover the exposed portions of the plurality of active patterns and the semiconductor fin. A storage electrode may be connected to the conductive plug.

BRIEF DESCRIPTION OF THE DRAWINGS

Example embodiments will be more clearly understood from the following detailed description taken in conjunction with the accompanying drawings. FIGS. 1-13E represent non-limiting, example embodiments as described herein.

FIG. 1 is a plan view of a semiconductor device according to example embodiments;

FIGS. 4A through 12A are perspective views illustrating a method of manufacturing the semiconductor device in FIG. 2A;

FIGS. 4B through 12B are sectional views illustrating a method of manufacturing the semiconductor device in FIG. 2B;

FIGS. 4C through 12C are sectional views illustrating a method of manufacturing the semiconductor device in FIG. 2C;

FIGS. 13B through 13E are sectional views illustrating a method of manufacturing the semiconductor device in FIG. 13A.

Figure 1:
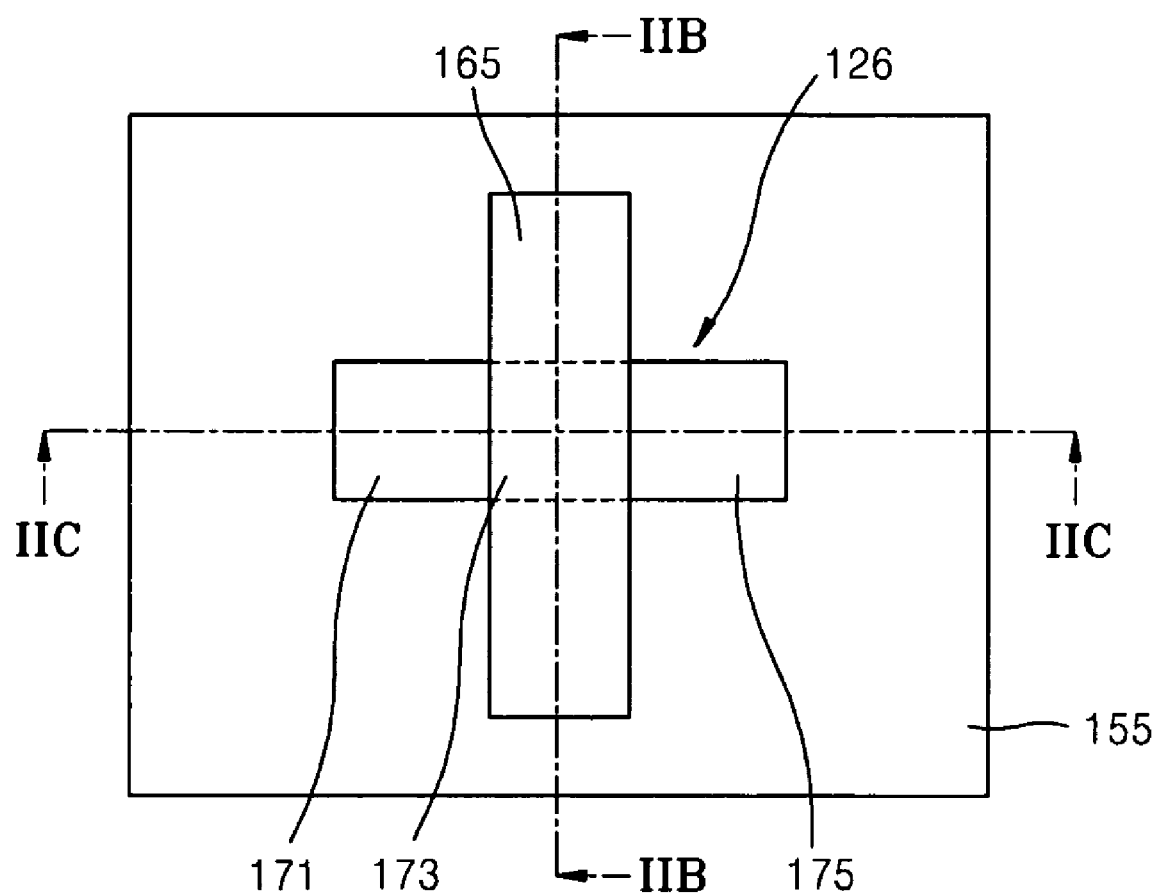

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will now be described more fully with reference to the accompanying drawings, in which example embodiments are shown. Example embodiments may, however, be embodied in many different forms and should not be construed as being limited to example embodiments set forth herein; rather, these embodiments are provided so that this disclosure will be thorough and complete, and will fully convey example embodiments to those skilled in the art. In the drawings, the thicknesses of layers and regions are exaggerated for clarity. Like reference numerals in the drawings denote like elements, and thus their description will be omitted It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals refer to like or similar elements throughout. As used herein, the term "and/or" includes any and all combinations of one or more of the associated listed items.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of illustratively idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2A:
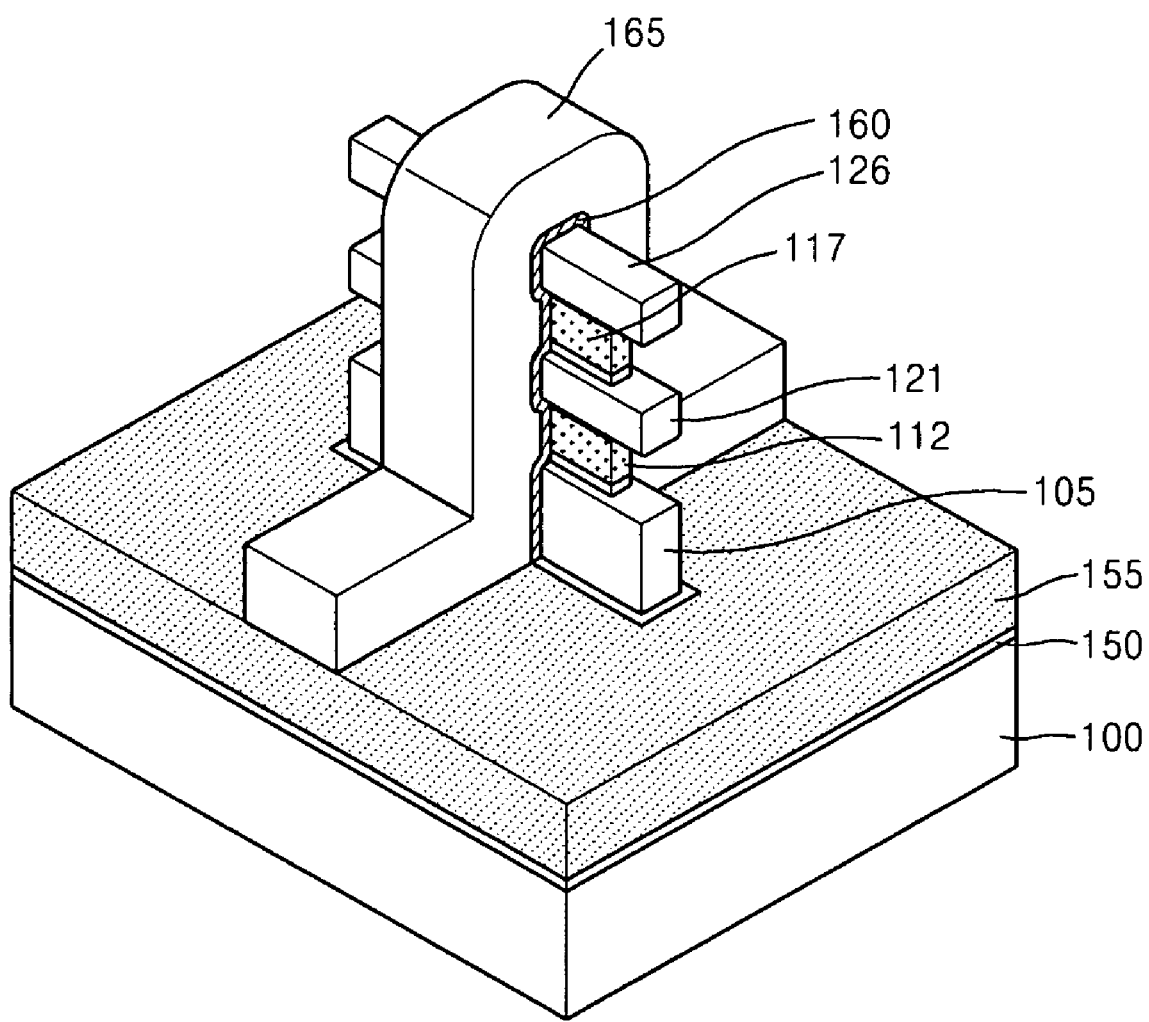
FIG. 2A is a perspective view of the semiconductor device in FIG. 1.
Figure 2B:
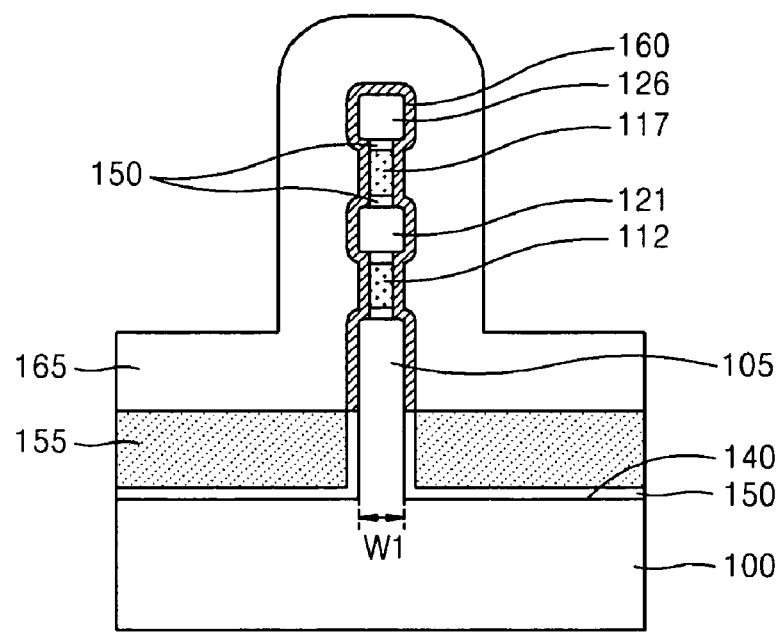
FIG. 2B is a sectional view of the semiconductor device taken along line IIB-IIB in FIG. 1.
Figure 2C:
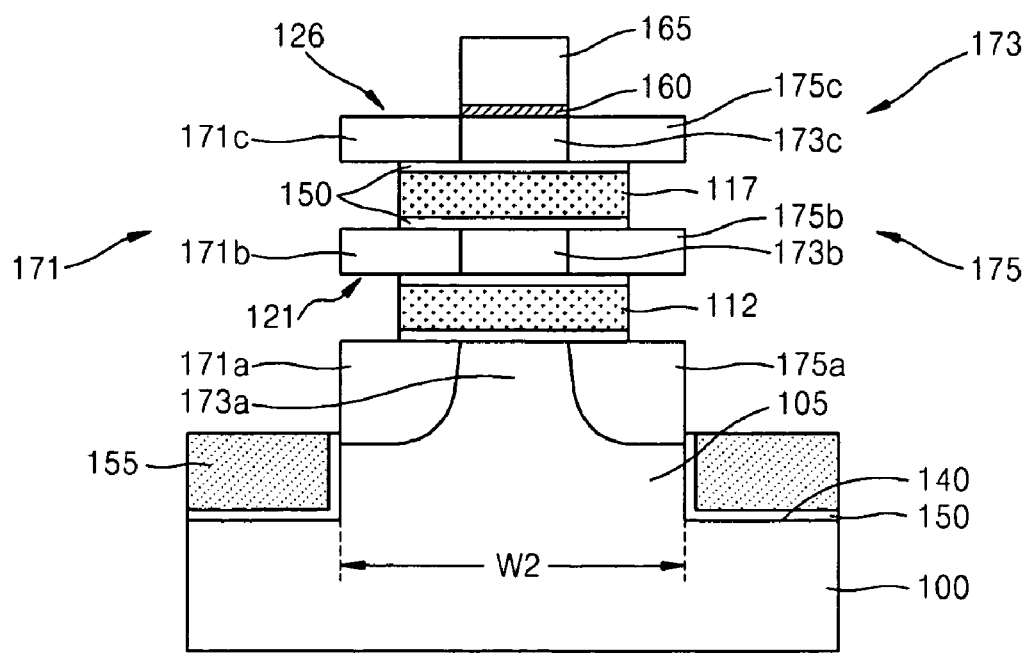
FIG. 2C is a sectional view of the semiconductor device taken along line IIC-IIC in FIG. 1.

FIG. 1 is a plan view of a semiconductor device according to example embodiments. FIG. 2A is a perspective view of the semiconductor device in FIG. 1. FIG. 2B is a sectional view of the semiconductor device taken along line IIB-IIB in FIG. 1. FIG. 2C is a sectional view of the semiconductor device taken along line IIC-IIC in FIG. 1. Referring to FIG. 1 and FIGS. 2A through 2C, a semiconductor substrate 100 may include a semiconductor fin 105 protruding from a surface of the semiconductor substrate 100, and a trench 140 defining the semiconductor fin 101. The semiconductor fin 101 has a first width W1 in a first direction and a second width W2 in a second direction that crosses the first direction.

A first insulation layer 155 fills a portion of the trench 140 to expose a portion of the semiconductor fin 105. The first insulation layer 155 may include an isolation layer (not shown). One or more semiconductor patterns 121 and 126 are arranged in a direction in which the semiconductor fin 105 protrudes from the semiconductor substrate 100, with a separation gap from the semiconductor fin 105. The semiconductor patterns 121 and 126 may include bar type semiconductor patterns having a cross-section with rounded edges. The semiconductor patterns 121 and 126 may have a width extending in the first direction, the width being substantially the same as the first width W1, and a width extending in the second direction, the width being substantially the same as the second width W2. The semiconductor patterns 121 and 126 may be epitaxially-grown monocrystalline silicon patterns. Portions of the semiconductor patterns 121 and 126 that overlap a gate 165 function as active patterns.

A first support pattern 112 is arranged between the semiconductor fin 105 and the semiconductor pattern 121, which is arranged closer to the semiconductor fin 105 in the direction in which the semiconductor fin 105 protrudes. A second support pattern 117 is arranged between the semiconductor patterns 121 and 126, which are arranged close to each other in the direction in which the semiconductor fin 105 protrudes. The first and second support patterns 112 and 117 may be insulation patterns, for example, silicon-germanium-oxide layer patterns. The first and second support patterns 112 and 117 may prevent or reduce the semiconductor patterns 121 and 126 from lifting by supporting the semiconductor patterns 121 and 126.

Second insulation layers 150 may be interposed between the semiconductor fin 105 and the first support pattern 112, the semiconductor pattern 121 and each of the first and second support patterns 112 and 117, the second support pattern 117 and the semiconductor pattern 126, and the insulation layer and each of the semiconductor substrate 100 and the semiconductor fin 105. The second insulation layer 150 may be a thermal oxide layer. The gate 165 is arranged in the first direction to cross the semiconductor patterns 121 and 126 and the semiconductor fin 105. The gate 165 may be formed to overlap with portions of the semiconductor patterns 121 and 126, the second insulation layer 150 and the first and second support patterns 112 and 117. A gate insulation layer 160 may be further arranged under the gate 165.

A source region 171 and a drain region 175 are formed in the portions the semiconductor fin 105 and the semiconductor patterns 121 and 126 that are on both sides of the gate 165. The source region 171 may include impurity regions 171a, 171b and 171c, which are located in the semiconductor fin 105 and the semiconductor patterns 121 and 126, respectively. The drain region 175 may include impurity regions 175a, 175b and 175c, which are located in the semiconductor fin 105 and the semiconductor patterns 121 and 126, respectively. A channel region 173 is formed between the source region 171 and the drain region 175. The channel region 173 may include multiple channels 173a, 173b and 173c. Because the semiconductor patterns 121 and 126 have a bar type shape with a width in the first direction that is substantially equal along the bar, the widths of the impurity regions 171b and 171c forming the source region 171 in the first direction, and the widths of the impurity regions 175b and 175c forming the drain region 171 in the first direction are substantially equal to the widths of the channels 173b and 173c forming the channel region 173 in the first direction.

Figure 3A:
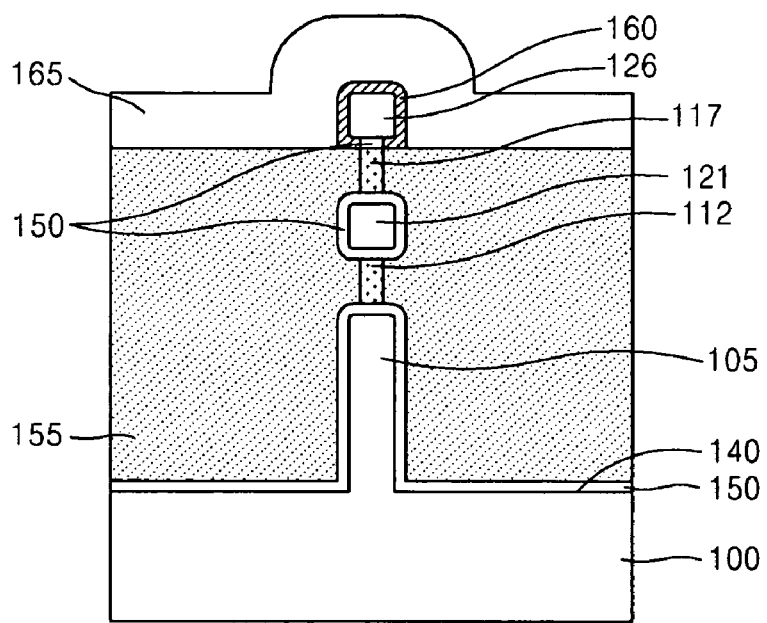
FIGS. 3A through 3C are sectional views of semiconductor devices according to example embodiments taken along line IIC-IIC in FIG. 1.
Figure 3B:
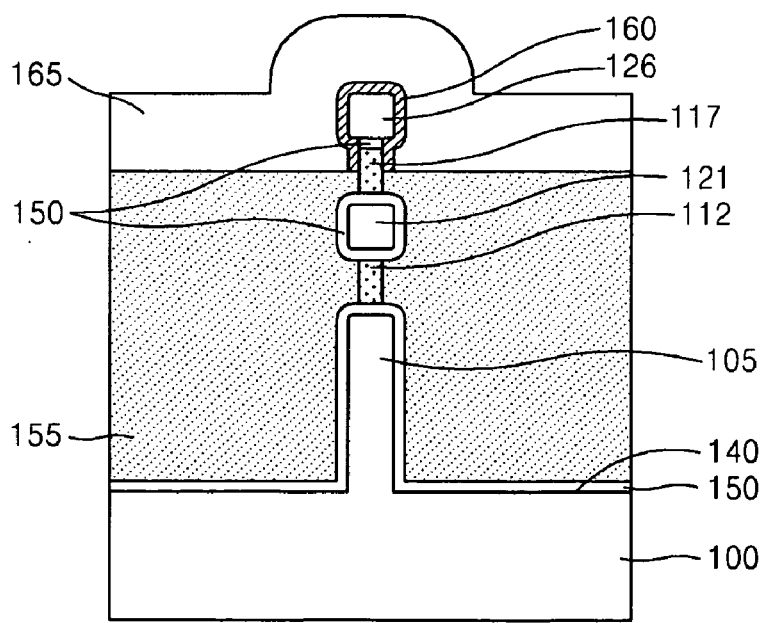

In example embodiments, as shown in FIGS. 3A and 3B, the gate 165 may have an omega-like shape crossing the semiconductor pattern 126, which is the furthest from the semiconductor fin 105, or crossing the semiconductor pattern 126 and a portion of the second support pattern 117. The semiconductor pattern 126 of the two semiconductor patterns 121 and 126 may function as an active pattern, and source and drain regions, e.g., the impurity regions 171c and 175c, may be formed in the semiconductor pattern 126. In example embodiments, the second insulation layer 150 and the first insulation layer 155 may be arranged to completely surround the semiconductor pattern 121 and the semiconductor fin 105.

Figure 3C:
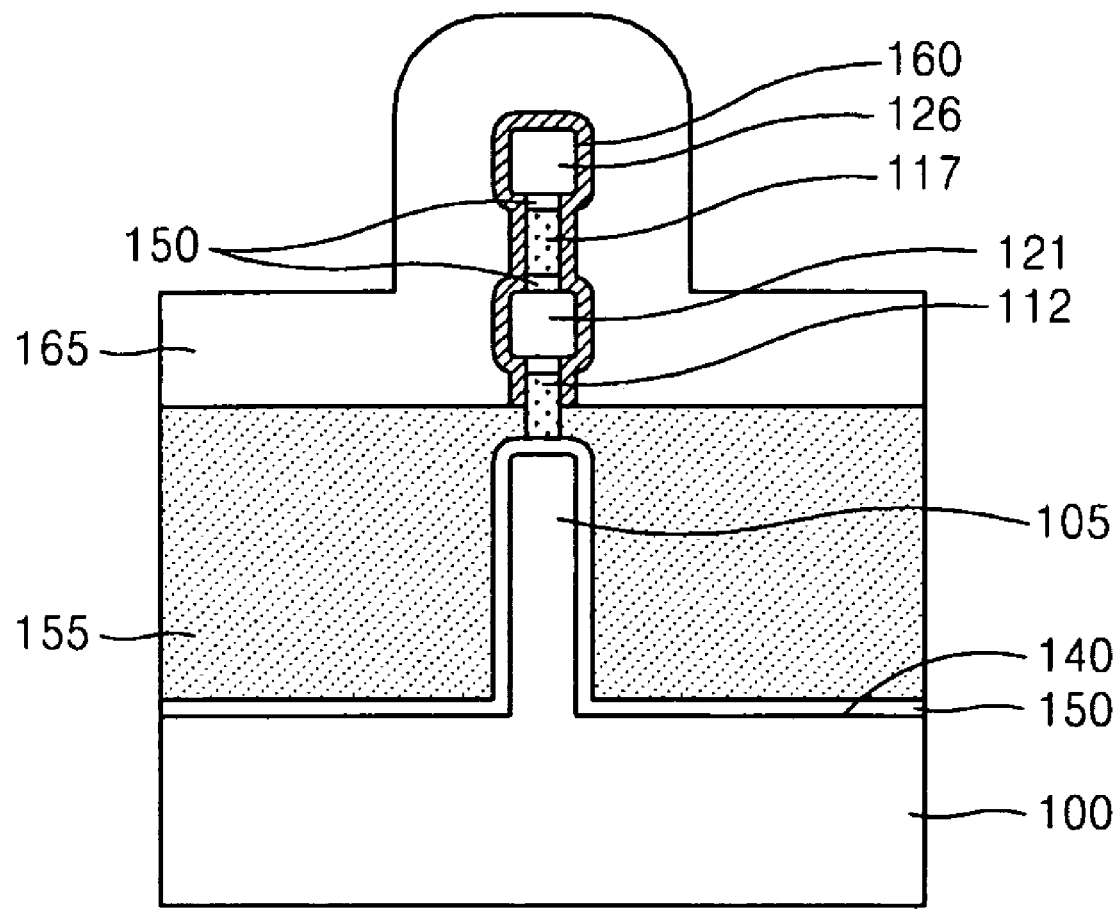

In addition, the gate 165 may have a GAA structure crossing the semiconductor patterns 121 and 126, or crossing the semiconductor patterns 121 and 126 and the first and second support patterns 112 and 117, as shown in FIG. 3C. Both the semiconductor patterns 121 and 126, except for the semiconductor fin 105, may function as active patterns. In example embodiments, the impurity regions 171b and 171c, which form the source region 171, may be arranged in the semiconductor patterns 121 and 126, and the impurity regions 175b and 175c, which form the drain region 175, may be arranged in the semiconductor patterns 121 and 126.

FIGS. 4A through 12A are perspective views illustrating a method of manufacturing the semiconductor device of FIG. 2A. FIGS. 4B through 12B are sectional views illustrating a method of manufacturing the semiconductor device of FIG. 2B. FIGS. 4C through 12C are sectional views illustrating a method of manufacturing the semiconductor device of FIG. 2C.

Figure 4A:
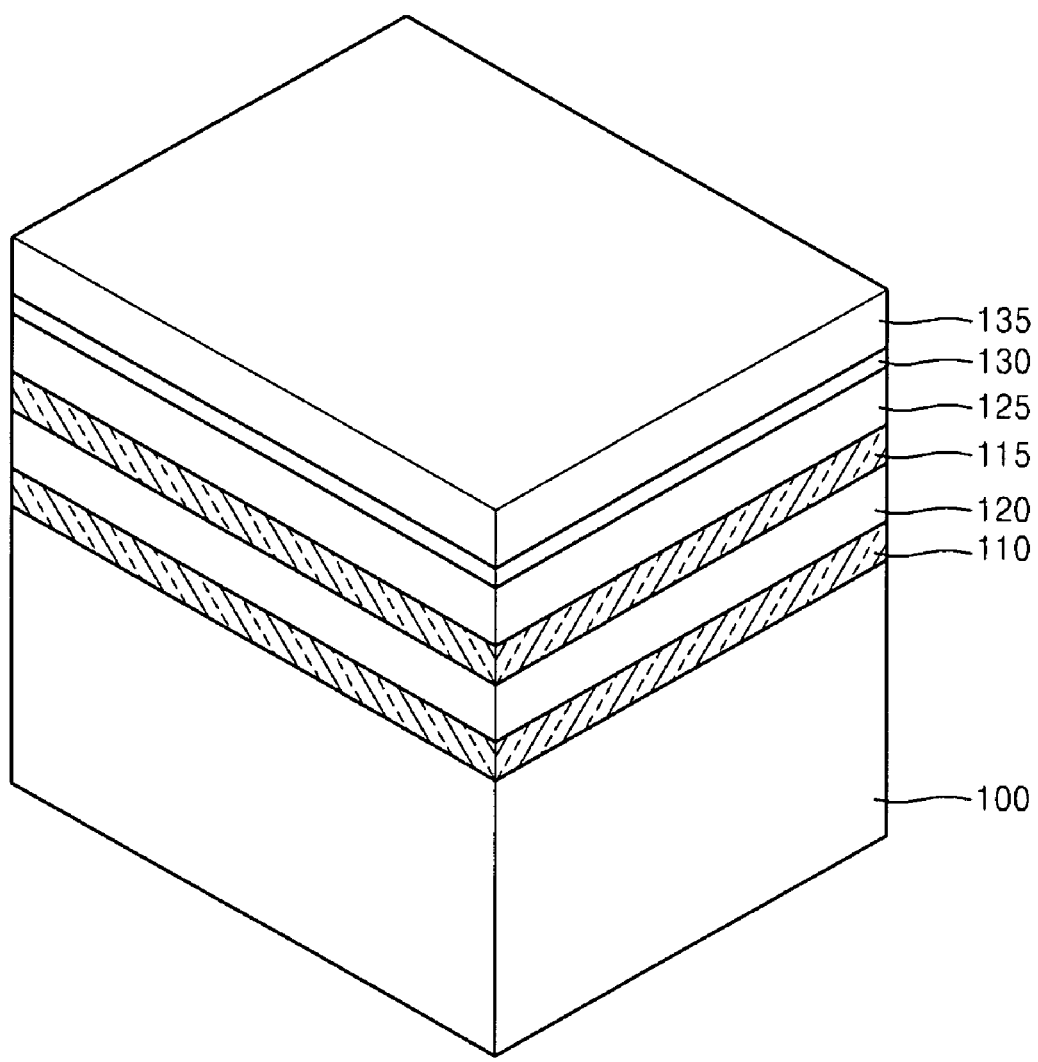
Figure 4B:
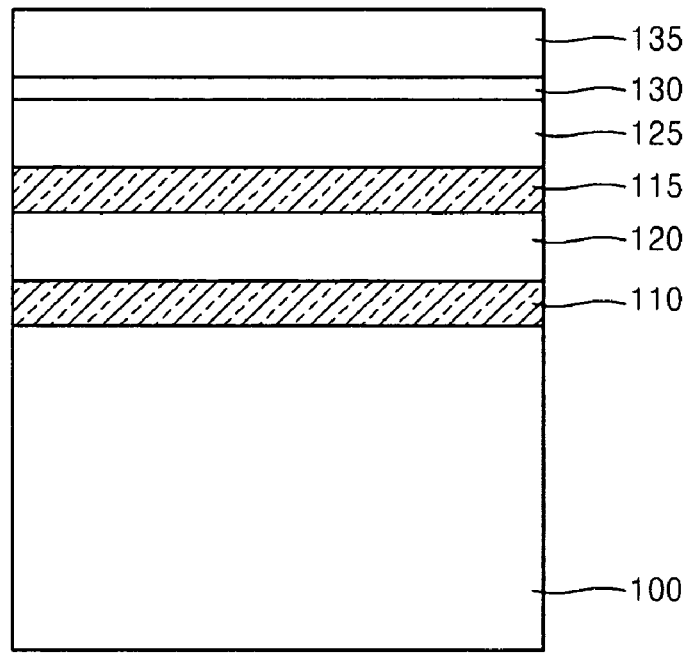
Figure 4C:
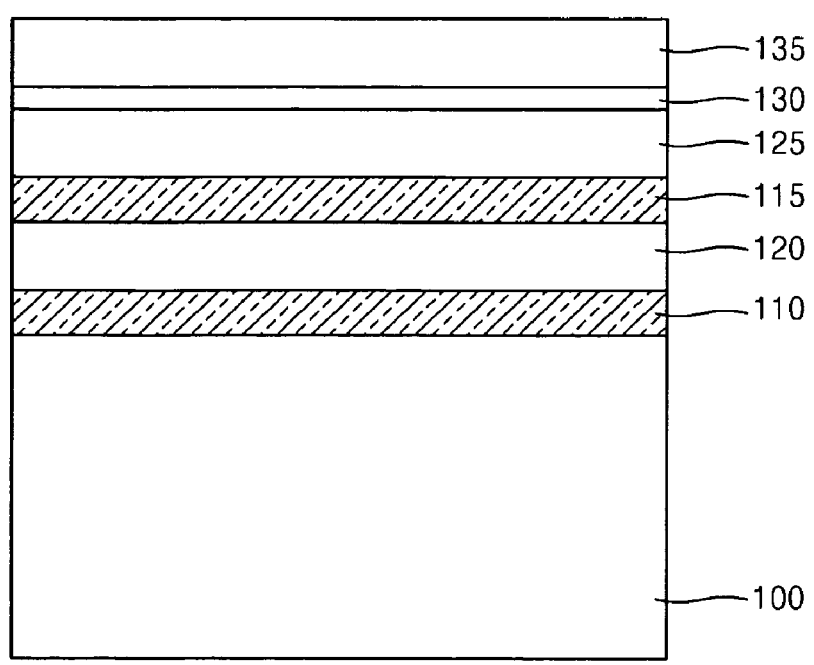

Referring to FIGS. 4A, 4B and 4C, multiple first semiconductor layers 110 and 115 and multiple second semiconductor layers 120 and 125 are alternately formed on a surface of the semiconductor substrate 100. The first semiconductor layers 110 and 115 may contain a material having an oxide rate that is different from the second semiconductor layers 120 and 125. The first semiconductor layers 110 and 115 may have a larger oxide rate than the second semiconductor layers 120 and 125. The first semiconductor layers 110 and 115 may be silicon-germanium (SiGe) layers. The second semiconductor layers 120 and 125 may be silicon layers. The first semiconductor layers 110 and 115 and the second semiconductor layers 120 and 125 may be formed using epitaxial growing processes. A pad insulation layer 130 and a hard mask layer 135 are formed on the upper second semiconductor layer 125. The pad insulation layer 130 may be an oxide layer. The hard mask layer 135 may be a nitride layer.

Figure 5A:
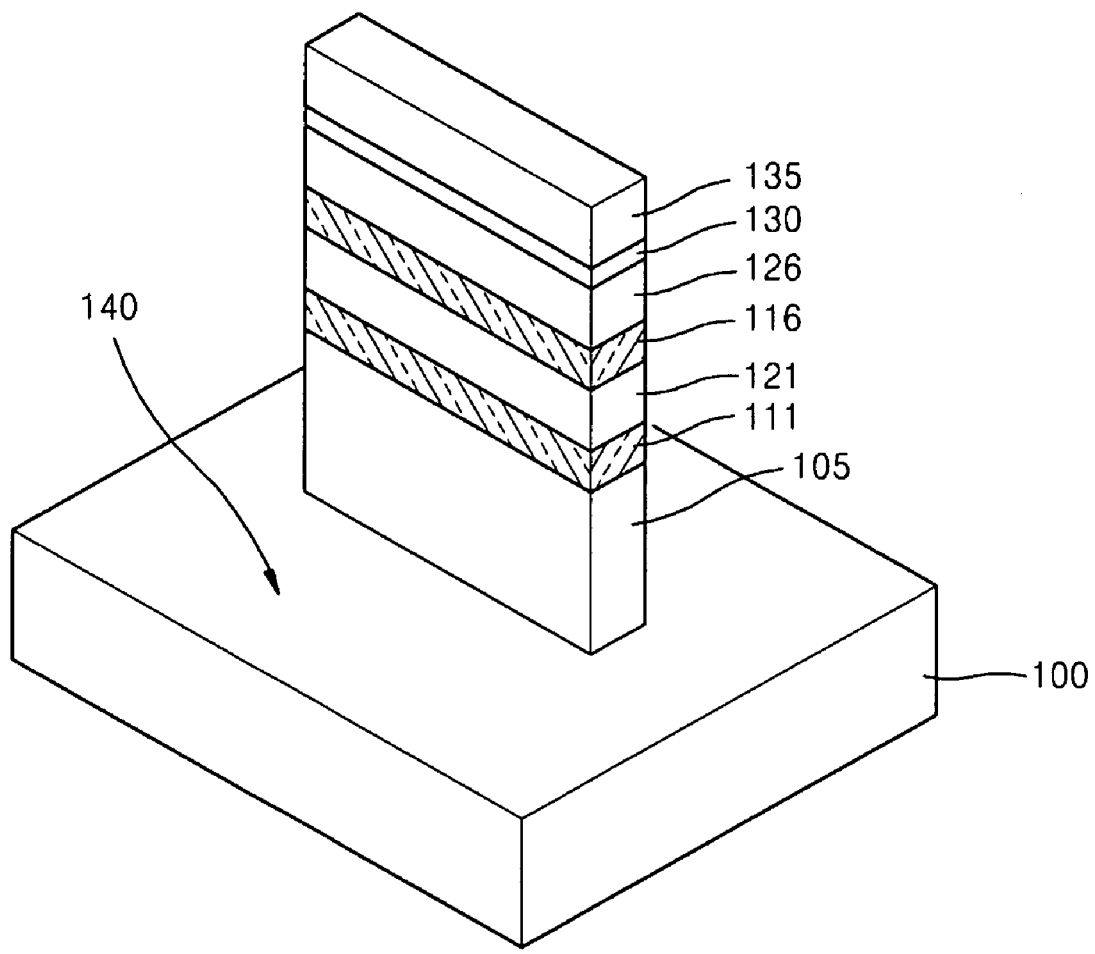
Figure 5B:
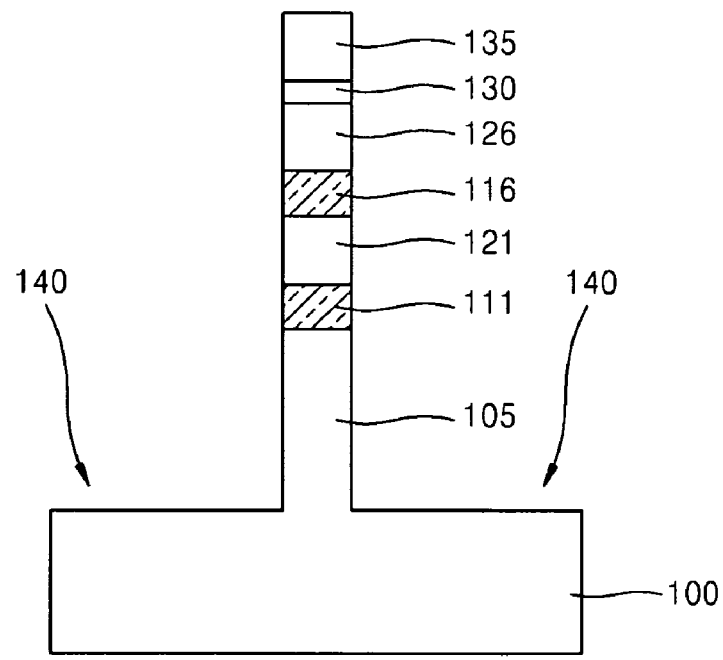
Figure 5C:
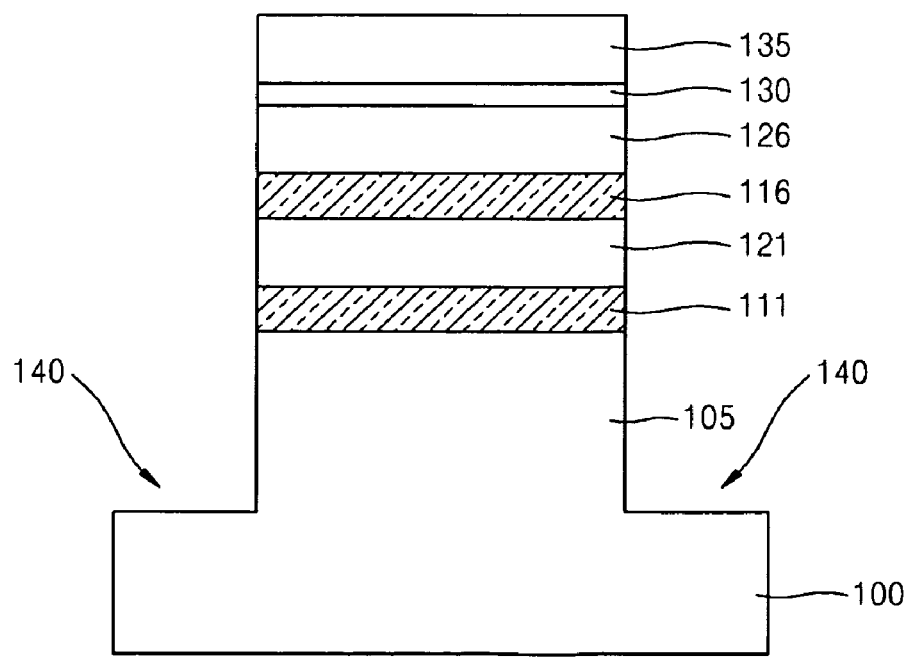

Referring to FIGS. 5A, 5B, and 5C, a photosensitive layer pattern (not shown) is formed on the hard mask layer 135. The hard mask layer 135 and the pad insulation layer 130 are patterned using the photosensitive layer pattern, resulting in remaining portions of the hard mask layer 135 and the pad insulation layer 130 that correspond to a semiconductor fin to be formed in a subsequent process. Portions of the first semiconductor layers 110 and 115, the second semiconductor layers 120 and 125, and the semiconductor substrate 100 are etched using the hard mask layer 135 as a mask. As a result, the semiconductor fin 105 protruding from the semiconductor substrate 100 is formed. First semiconductor patterns 111 and 116 and second semiconductor patterns 121 and 126 are formed, and a trench 140 defining the semiconductor fin 105 is formed.

Figure 6A:
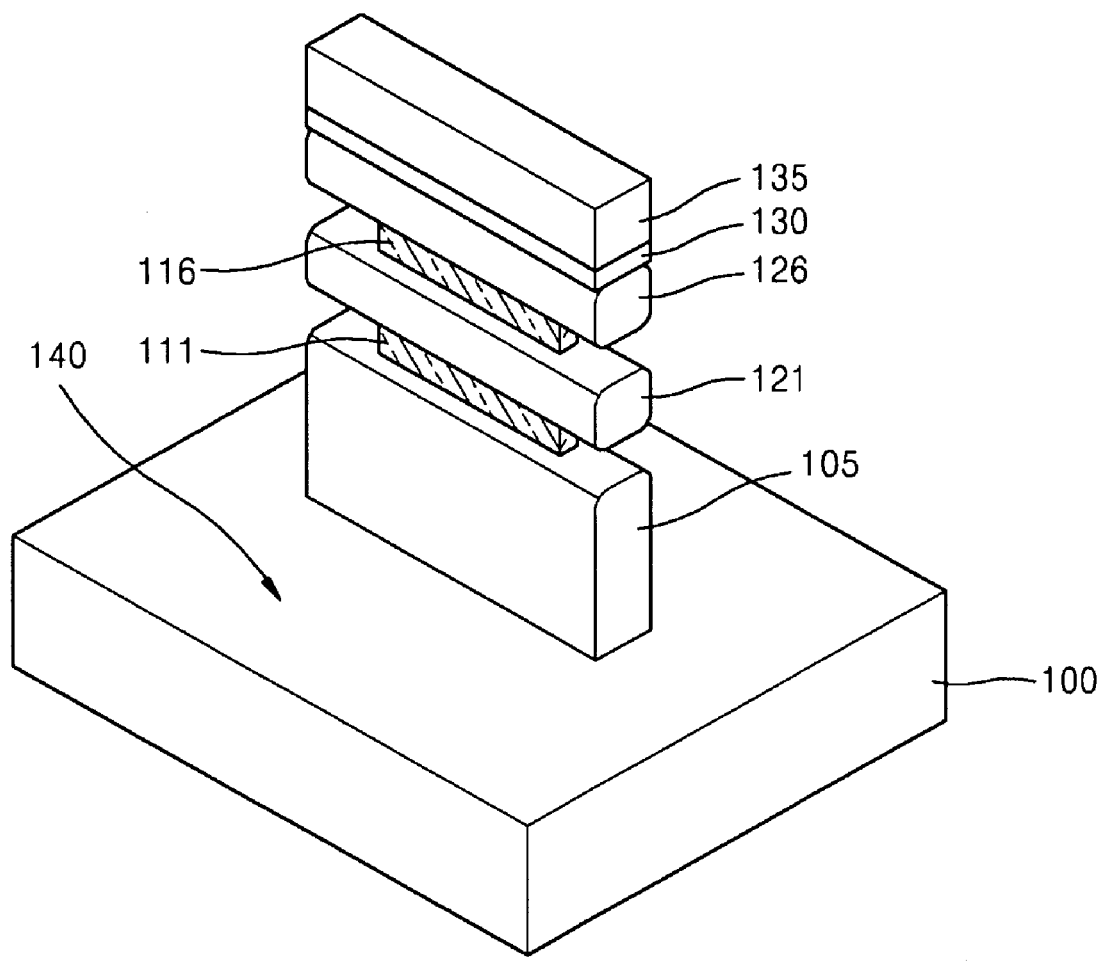
Figure 6B:
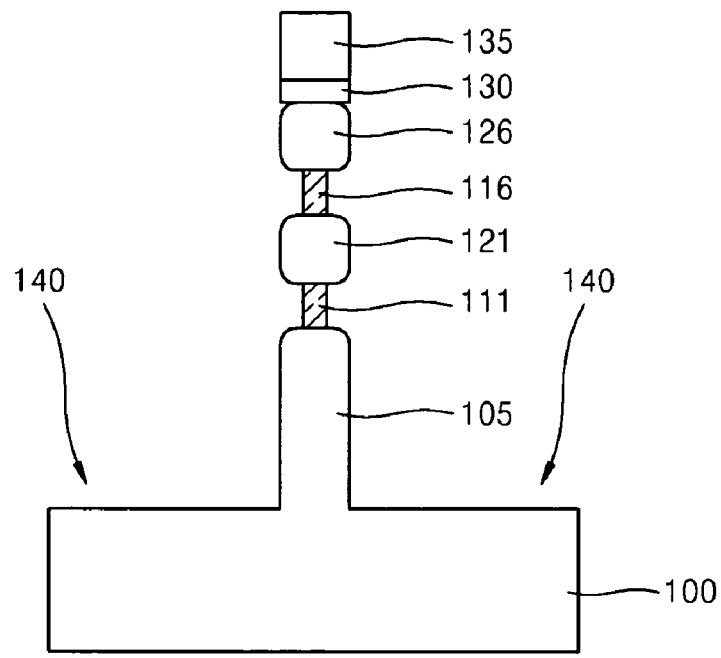
Figure 6C:
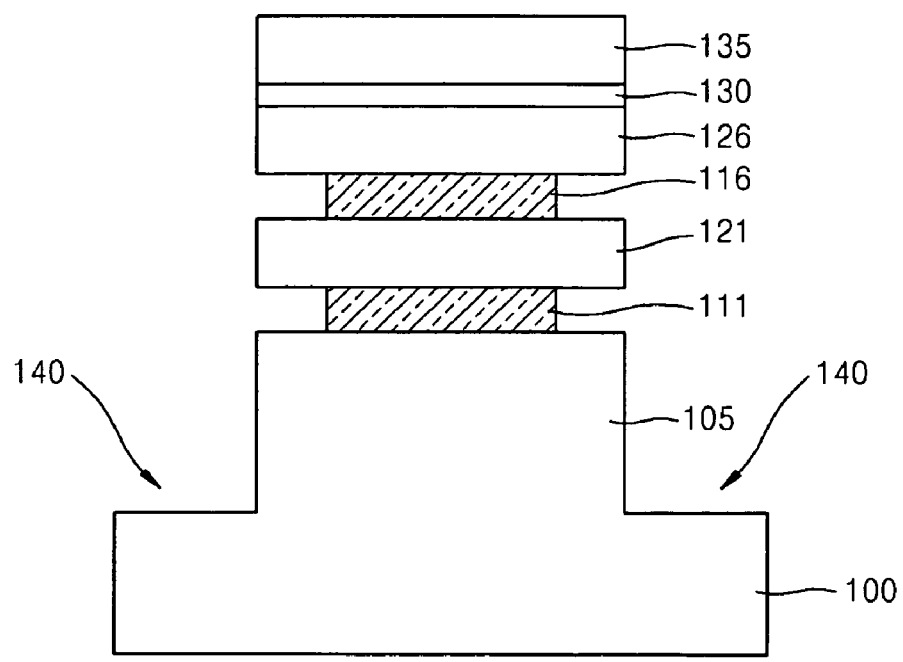

Referring to FIGS. 6A, 6B and 6C, the first semiconductor layers 110 and 115 and the second semiconductor layers 120 and 125 are etched using selective etching such that the first semiconductor layers 110 and 115 are etched more than the second semiconductor layers 120 and 125. As a result, the first semiconductor patterns 111 and 116 are indented from the edges of the second semiconductor patterns 121 and 126. In addition, the upper corners of the semiconductor fin 105 and the corners of the second semiconductor patterns 121 and 126 may be patterned to be round through the selective etching process. In example embodiments, the semiconductor layer patterns 121 and 126 may have a bar shape that extends in the second direction and has a cross-section with rounded edges.

Figure 7A:
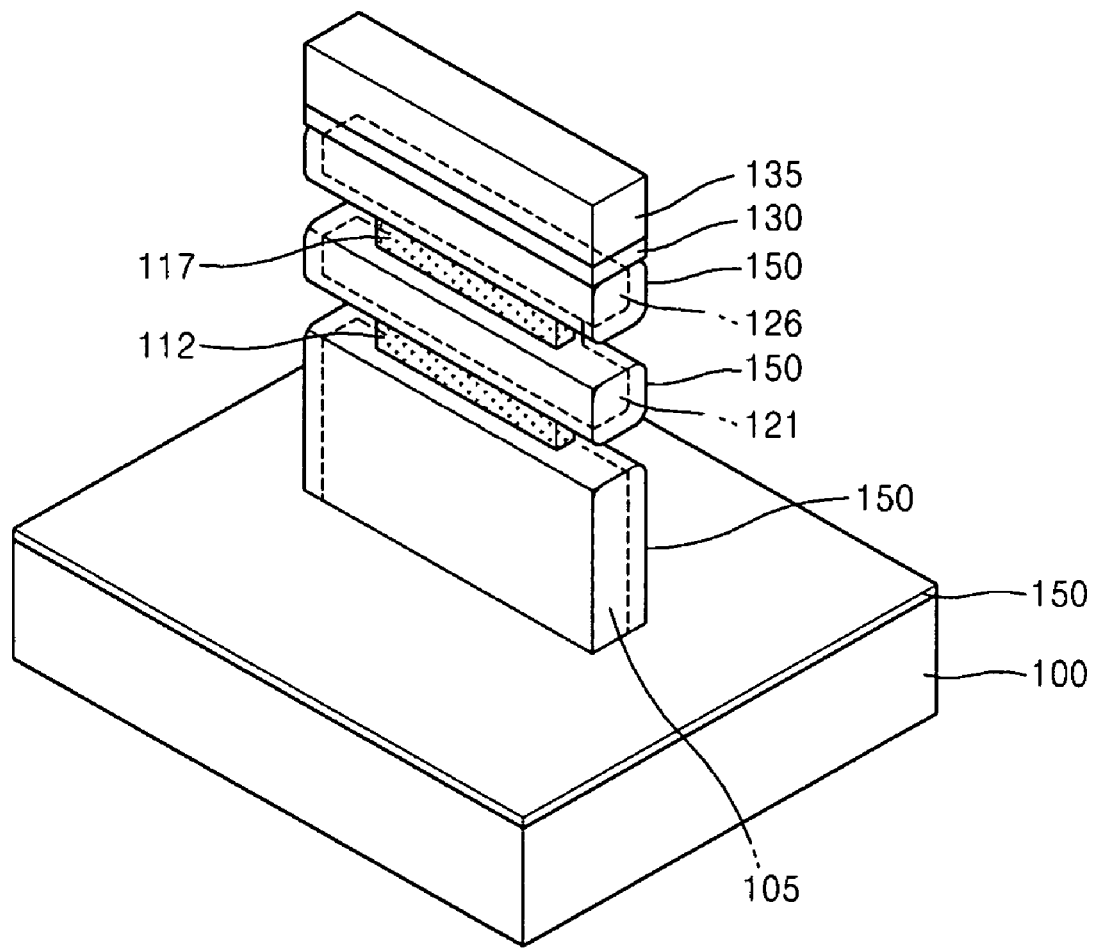
Figure 7B:
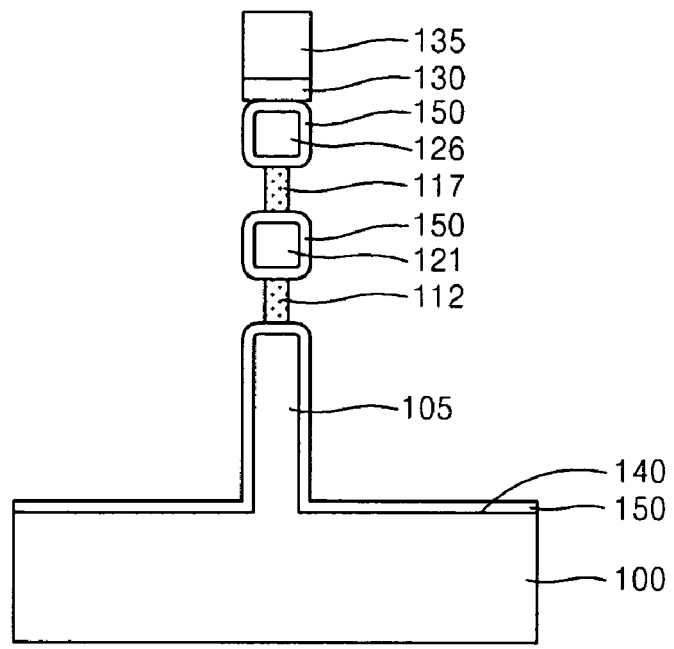
Figure 7C:
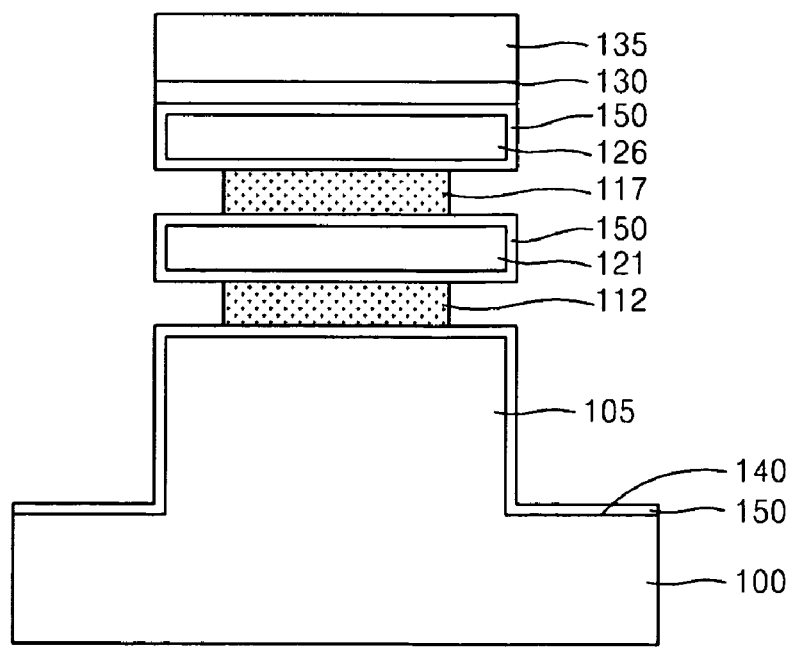

Referring to FIGS. 7A, 7B and 7C, the second insulation layer 150 is formed using a sidewall oxidation process. The second insulation layer 150 of a thermal oxide layer is formed to cover the surface of the semiconductor layer 110 and the surfaces of the semiconductor fin 105 and the second semiconductor patterns 121 and 126. Silicon-germanium that composes the first semiconductor patterns 111 and 116 is oxidized faster than silicon that composes the second semiconductor patterns 121 and 126 and the semiconductor substrate 100. As a result, the first semiconductor patterns 111 and 116 are changed into silicon-germanium-oxide layer patterns 112 and 117 during the sidewall oxidation process.

Figure 8A:
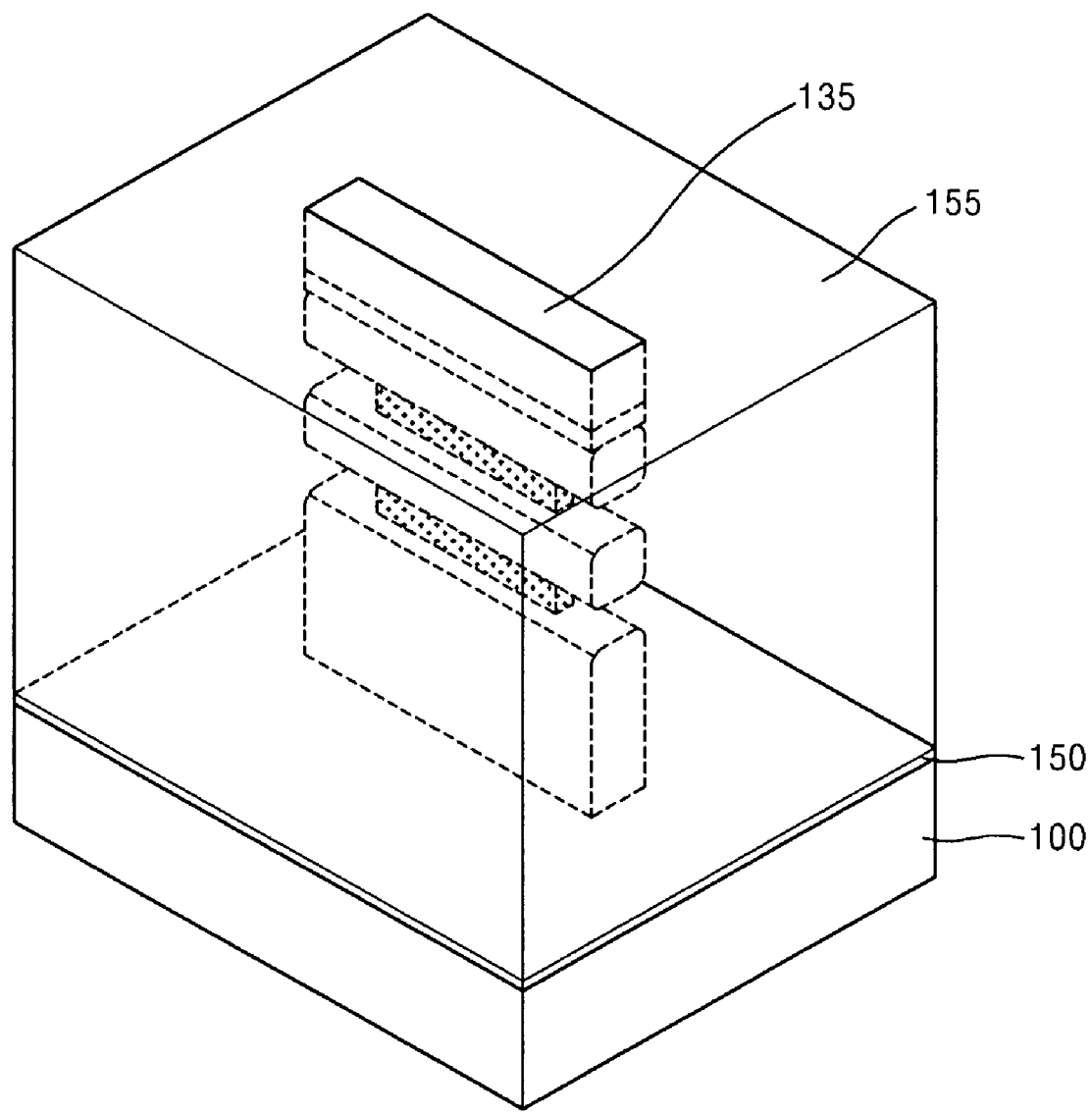
Figure 8B:
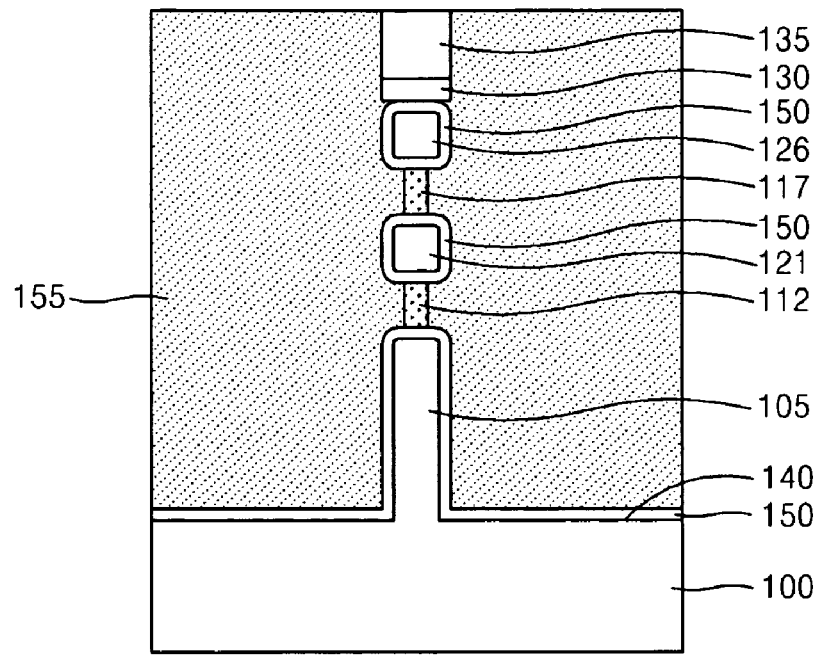
Figure 8C:
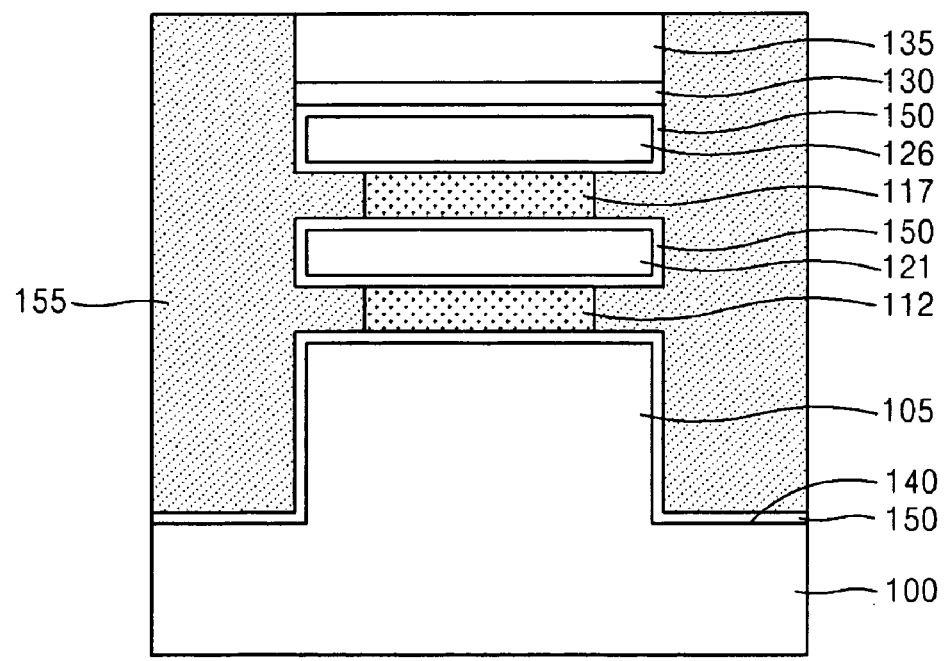

Referring to FIGS. 8A, 8B and 8C, the first insulation layer 155 is deposited on the semiconductor substrate 100 to fill the trench 140. The first insulation layer 155 is planarized using a chemical mechanical polishing (CMP) process with the hard mask layer 135 as an etch stop layer. When the surface of the second insulation layer 150 is non-uniform or when a step difference occurs due to the silicon-germanium-oxide layer patterns 112 and 117, a hydrogen annealing process may be performed before the first insulation layer 155 is formed. In addition, an oxidation layer (not shown), for example, a torene silazene (TOSZ) layer, may be formed in order that the first insulation layer 155 may be deposited without voids.

Figure 9A:
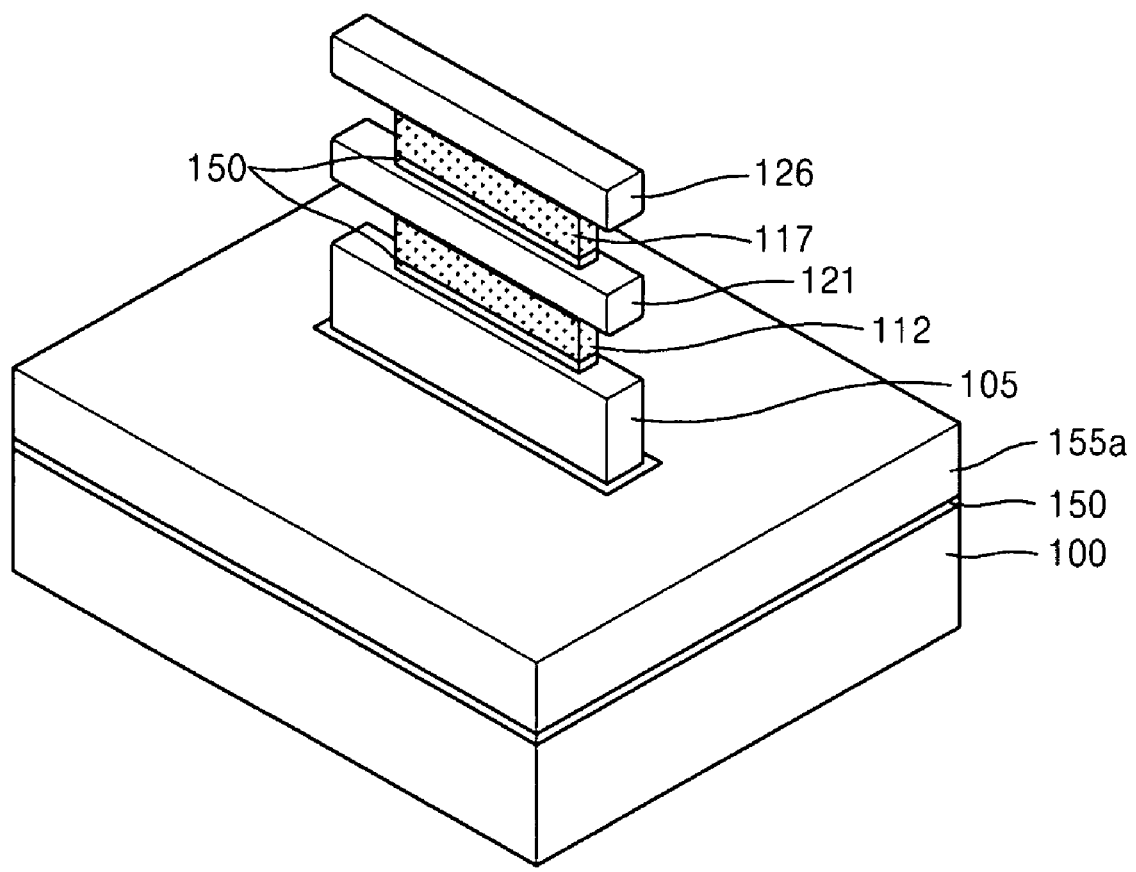
Figure 9B:
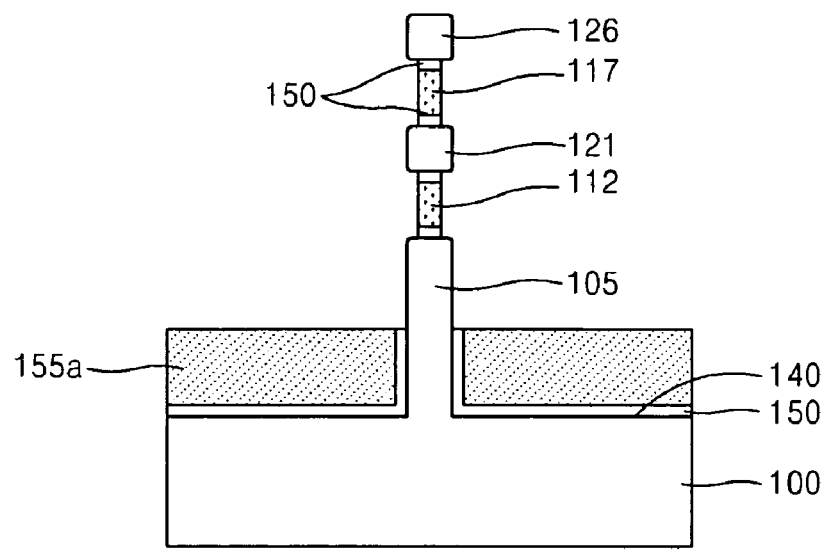
Figure 9C:
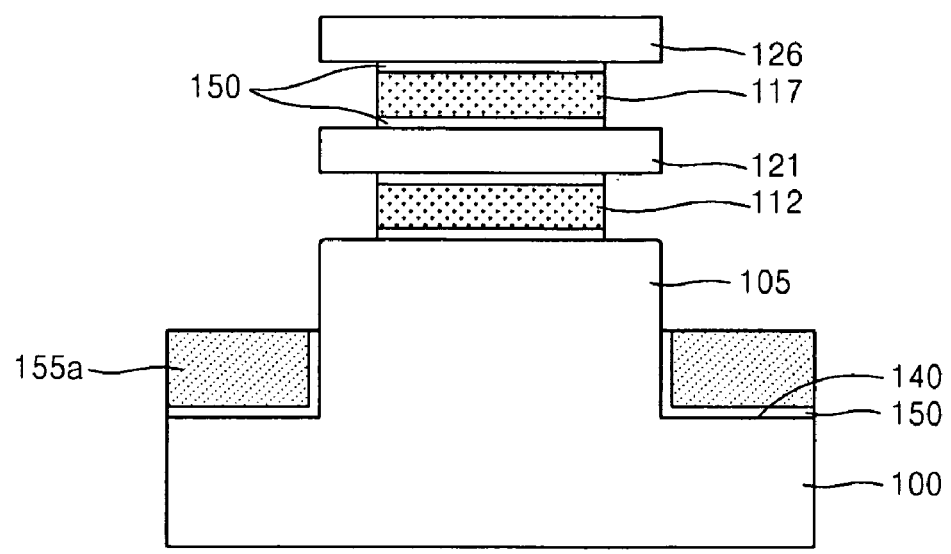

Referring to FIGS. 9A, 9B, and 9C, the hard mask layer 135, the pad insulation layer 130, and the second and first insulation layers 150 and 155 are etched, thereby forming the isolation layer 155a for the isolation of devices in the trench 140 and exposing the second semiconductor patterns 121 and 126 and a portion of the semiconductor fin 105 in the trench 140. In example embodiments, the silicon-germanium-oxide layer patterns 112 and 117 function as support members that support the second semiconductor patterns 121 and 126. The second semiconductor patterns 121 and 126 and the exposed portion of the semiconductor fin 105 function as active patterns. The second insulation layer 150 remains between the silicon-germanium-oxide layer pattern 117 and the second semiconductor patterns 121 and 126, and between the silicon-germanium-oxide layer pattern 112 and the semiconductor fin 105, and may function as a support member. The second insulation layer 150 may further remain between the first insulation layer 155 and the substrate 100 in the trench 140.

Figure 10A:
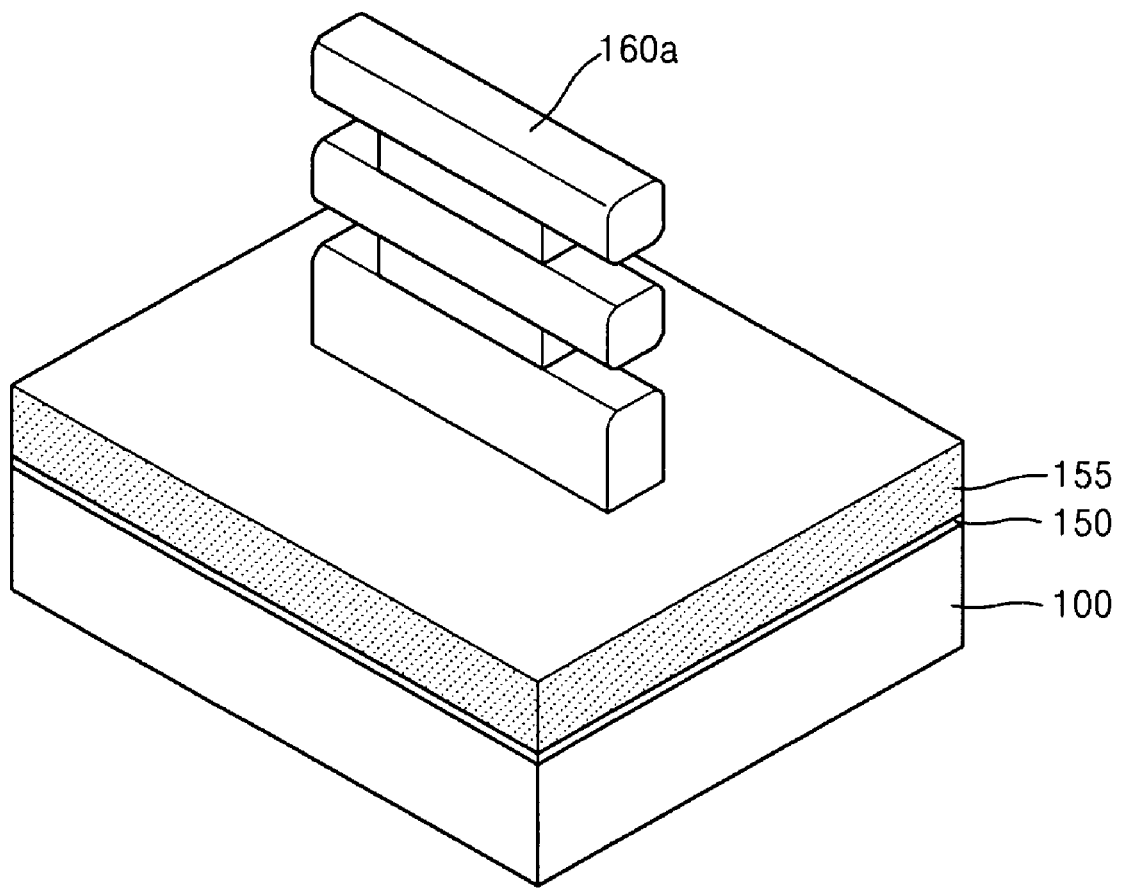
Figure 10B:
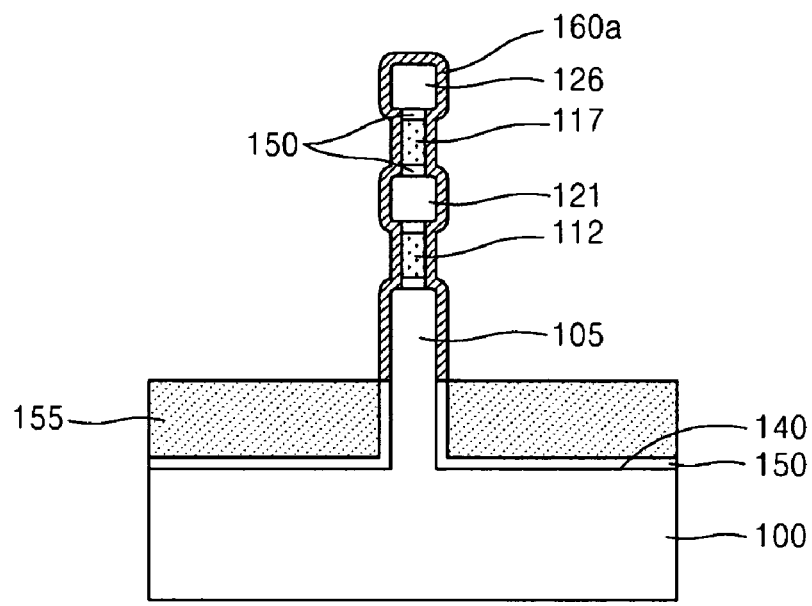
Figure 10C:
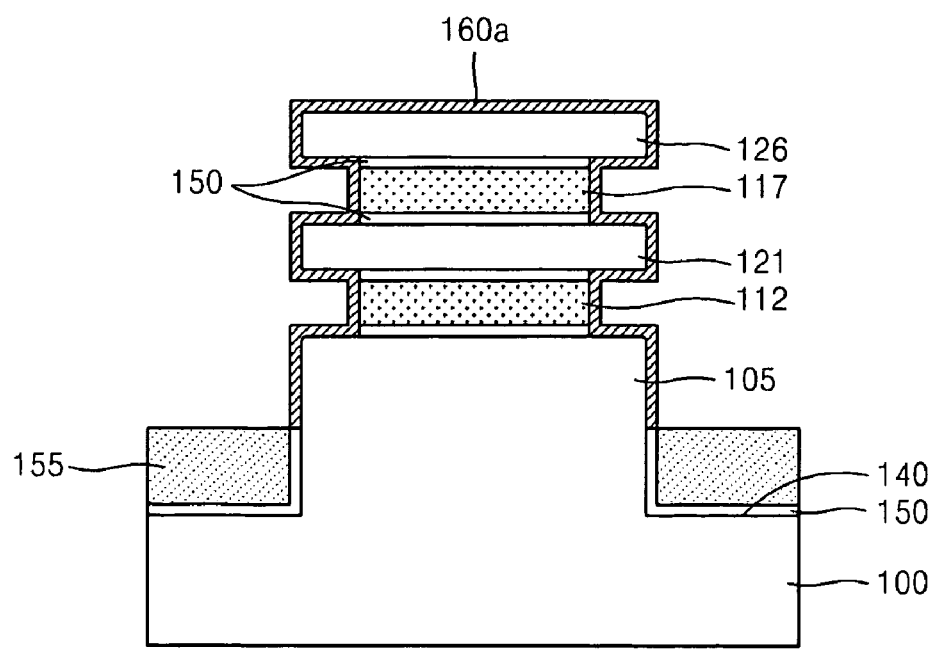
Figure 11A:
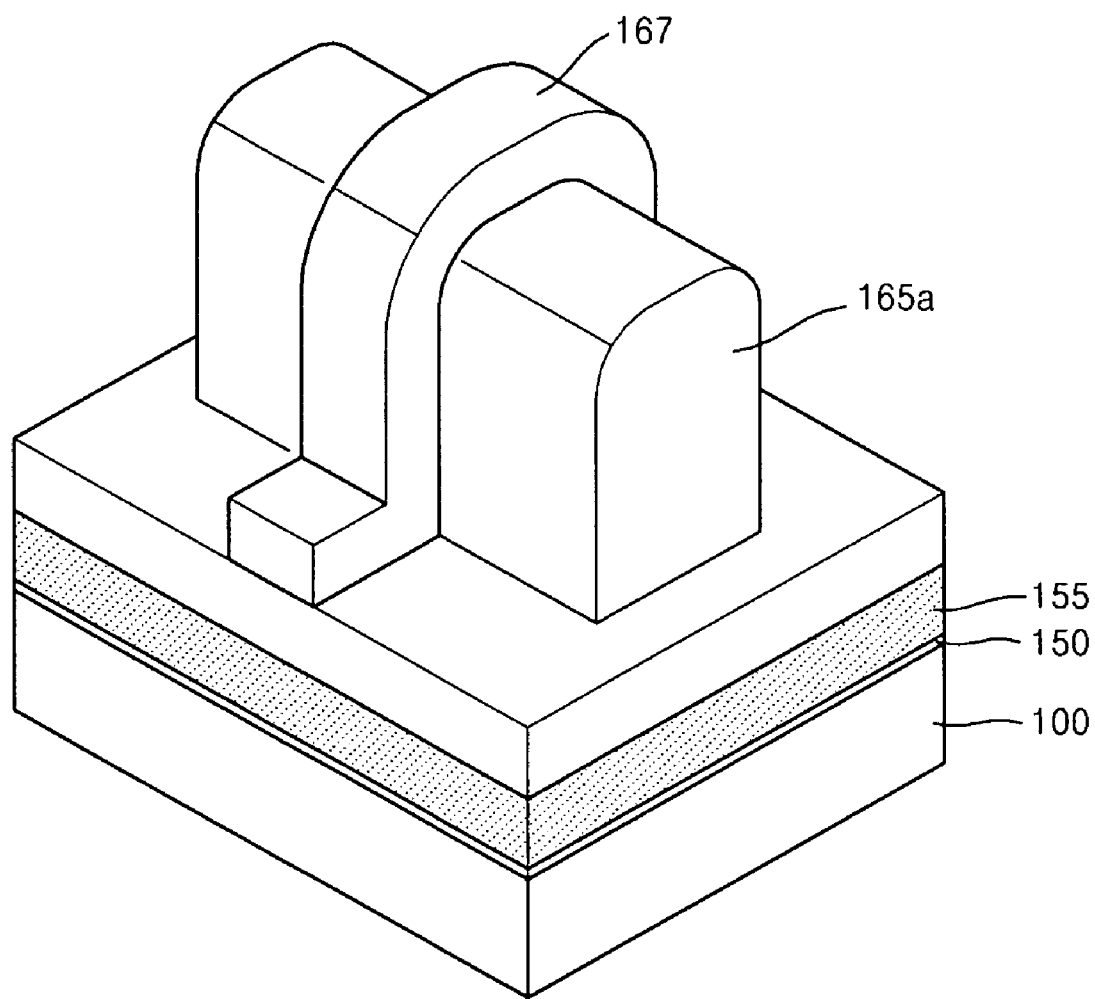
Figure 11B:
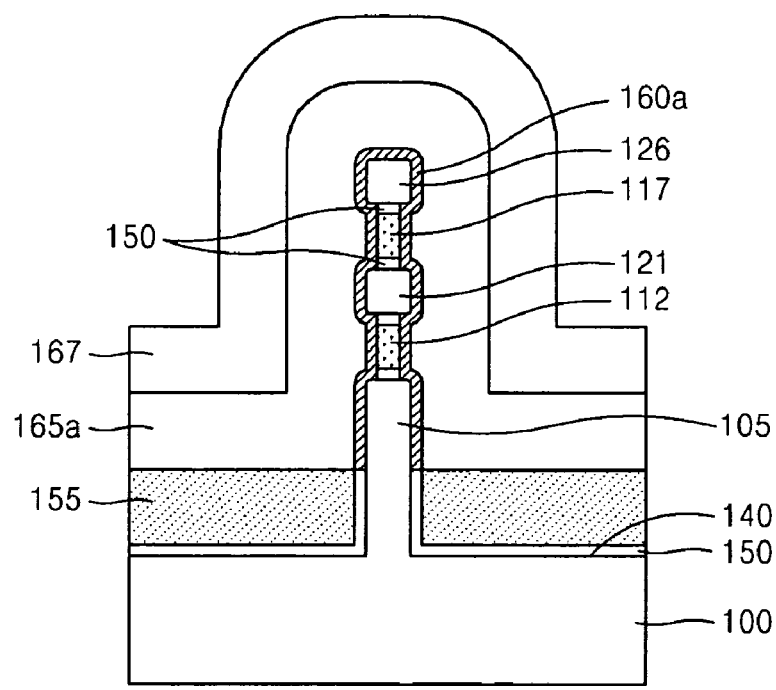
Figure 11C:
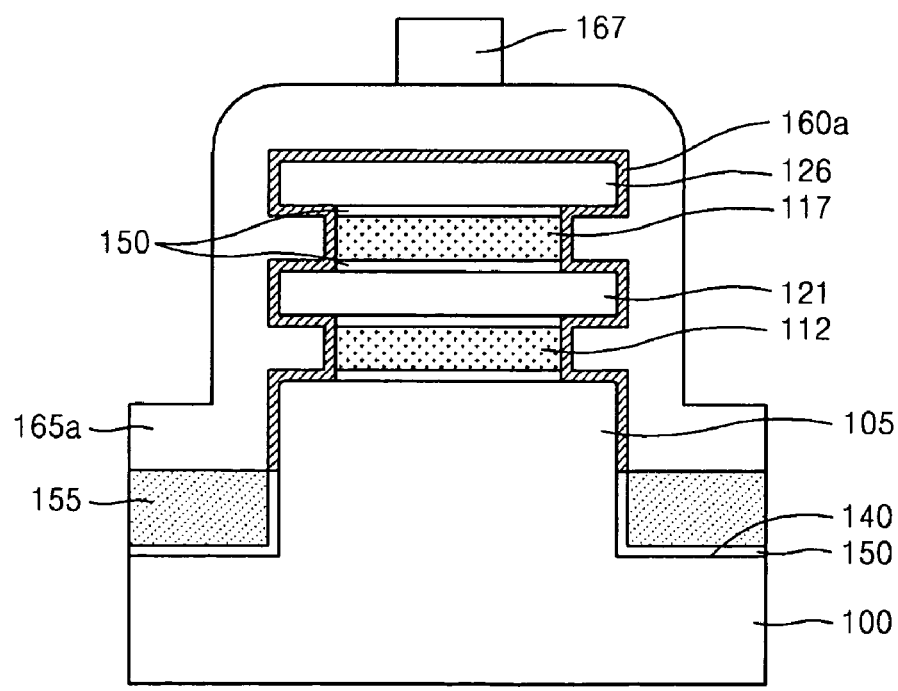

Referring to FIGS. 10A, 10B, and 10C, a third insulation layer 160a is formed on the entire surface of the semiconductor substrate 100 including the resulting structure. Referring to FIGS. 11A, 11B and 11C, a conductive material layer 165a for a gate electrode is formed on the third insulation layer 160a. A mask pattern 167 is formed on the conductive material layer 165a. The mask pattern 167 may be a photosensitive layer.

Figure 12A:
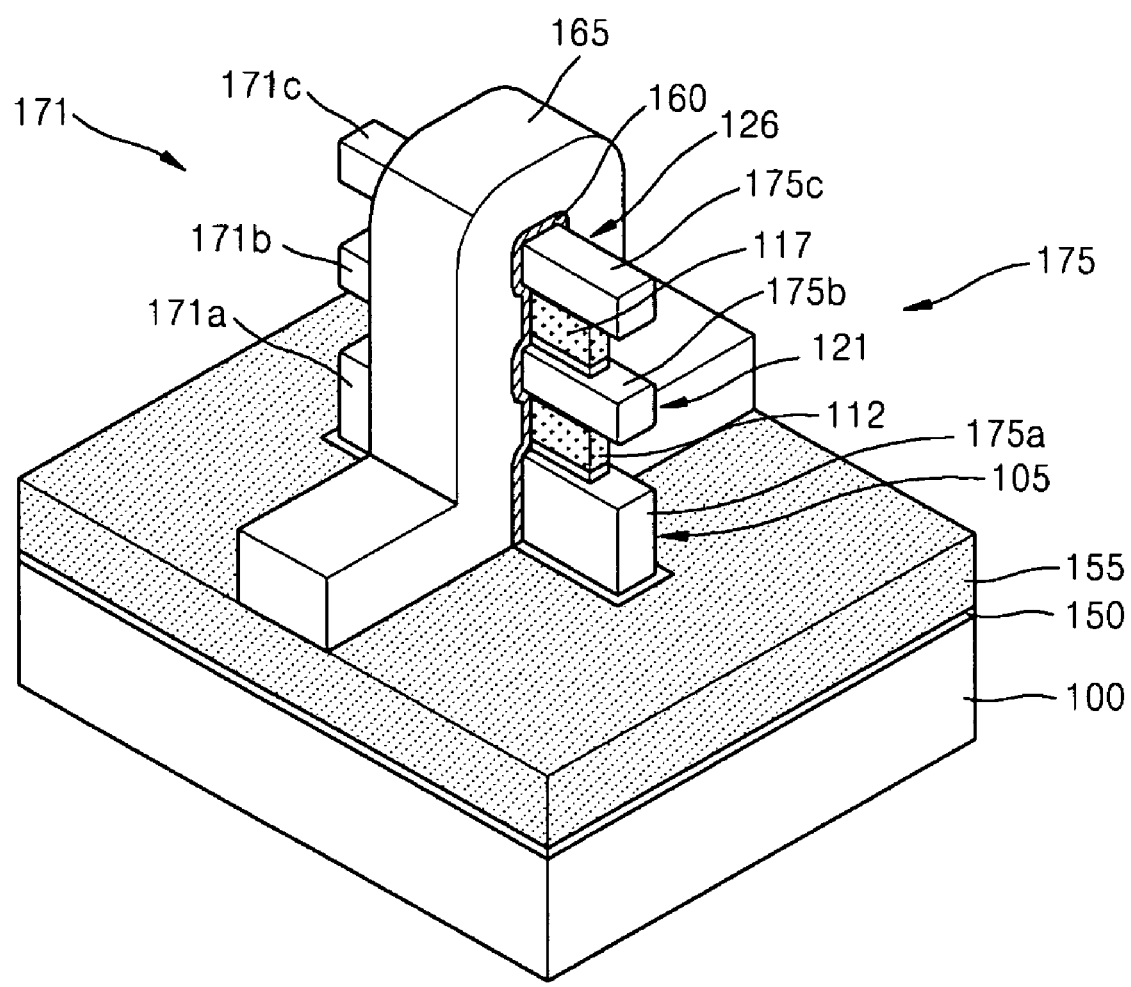
Figure 12B:
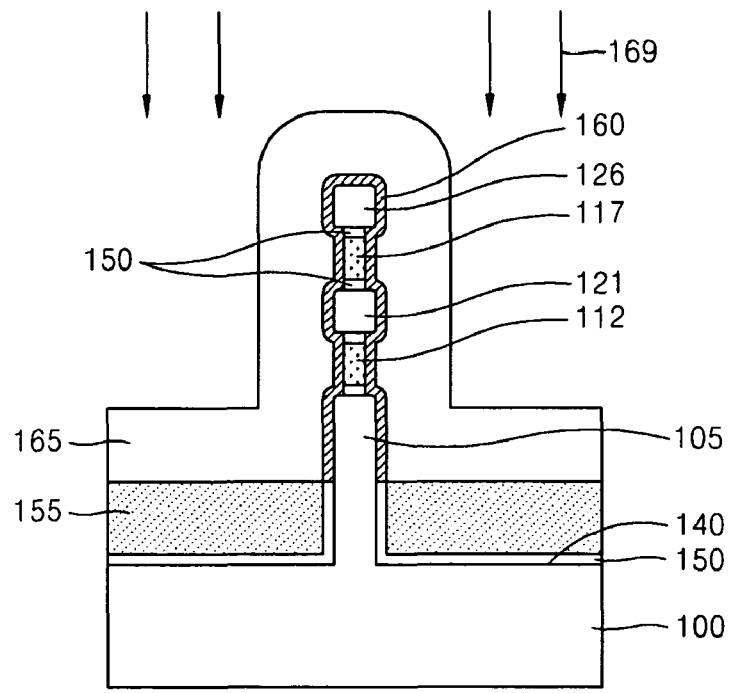
Figure 12C:
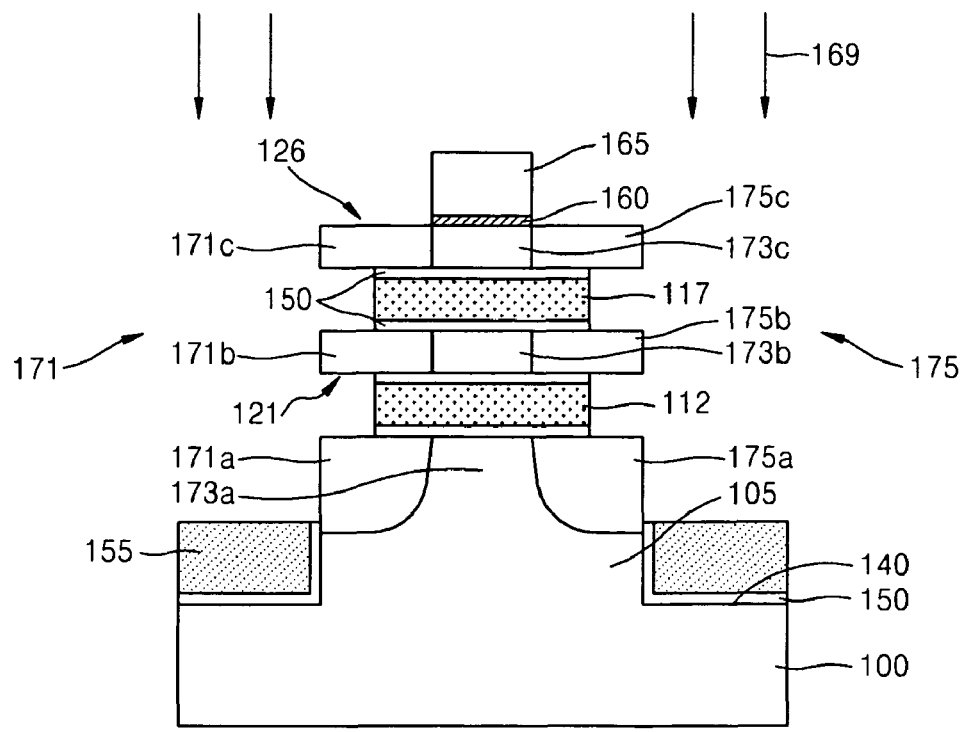

Referring to FIGS. 12A, 12B and 12C, the conductive material layer 165a and the third insulation layer 160a are patterned using the mask pattern 167 to form the gate 165 with a gate insulation layer 160. The gate 165 overlaps with at least one of the second semiconductor patterns 121 and 126 to cross the second semiconductor patterns 121 and 126 in the first direction. Impurities 169 of a specific conductivity type are ion-implanted into the exposed portions of the second semiconductor patterns 121 and 126 and the semiconductor fin 105 to form the source region 171, which may include the impurity regions 171a, 171b and 171c, and the drain region 175, which may include the impurity regions 175a, 175b and 175c. The impurities 169 may include impurities of an opposite conductivity type to the semiconductor substrate 100. The multiple channel regions 173a, 173b and 173c may be between the impurity regions 171a, 171b and 171c of the source region 171 and the impurity regions 175a, 175b and 175c of the drain region 175, respectively. The source region 171 and the drain region 175 may be formed using either an oblique ion implantation process or right-angle plasma doping. The remaining mask pattern 167 is removed.

Figure 13A:
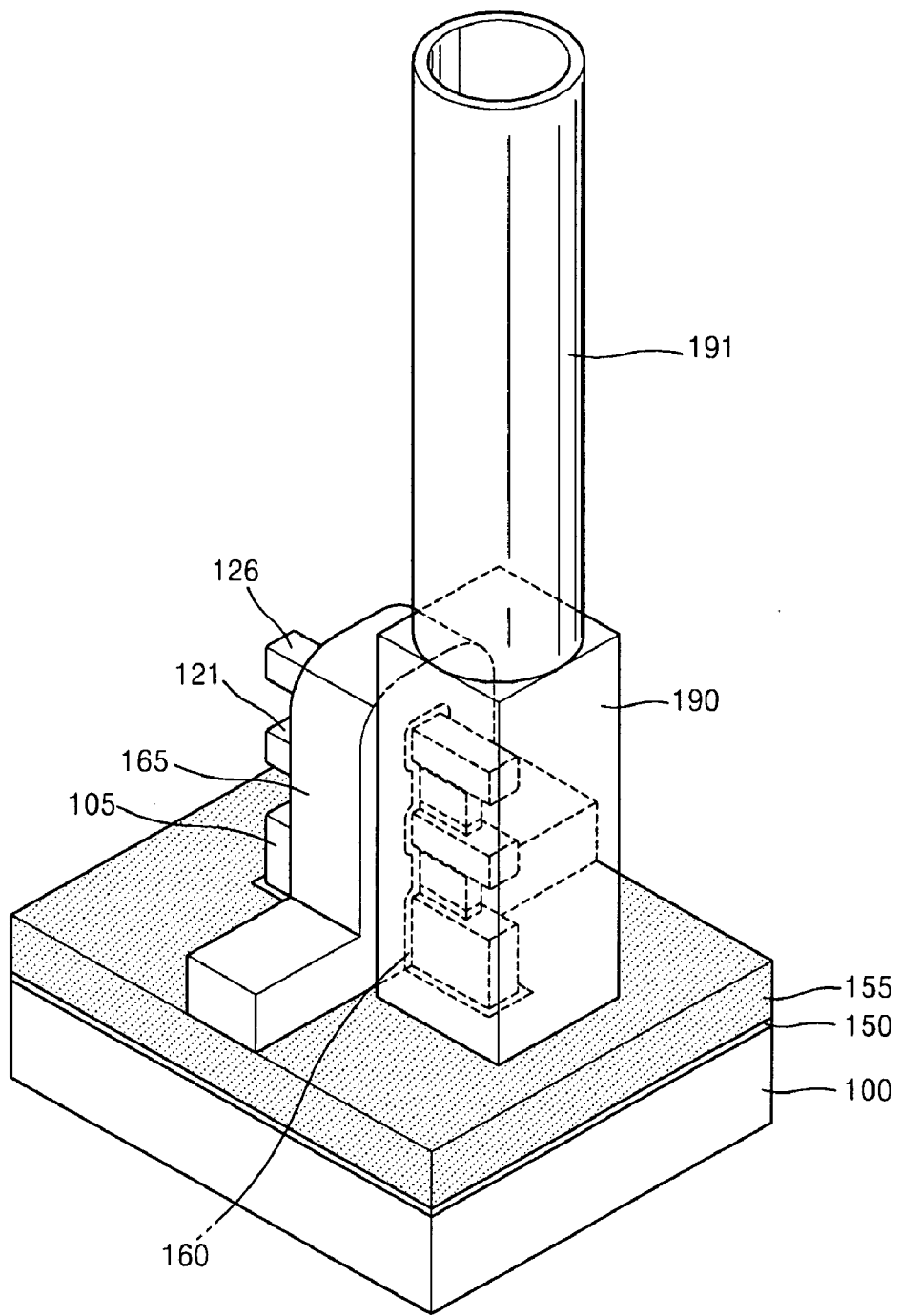
FIG. 13A is a perspective view of a semiconductor device according to example embodiments.
Figure 13B:
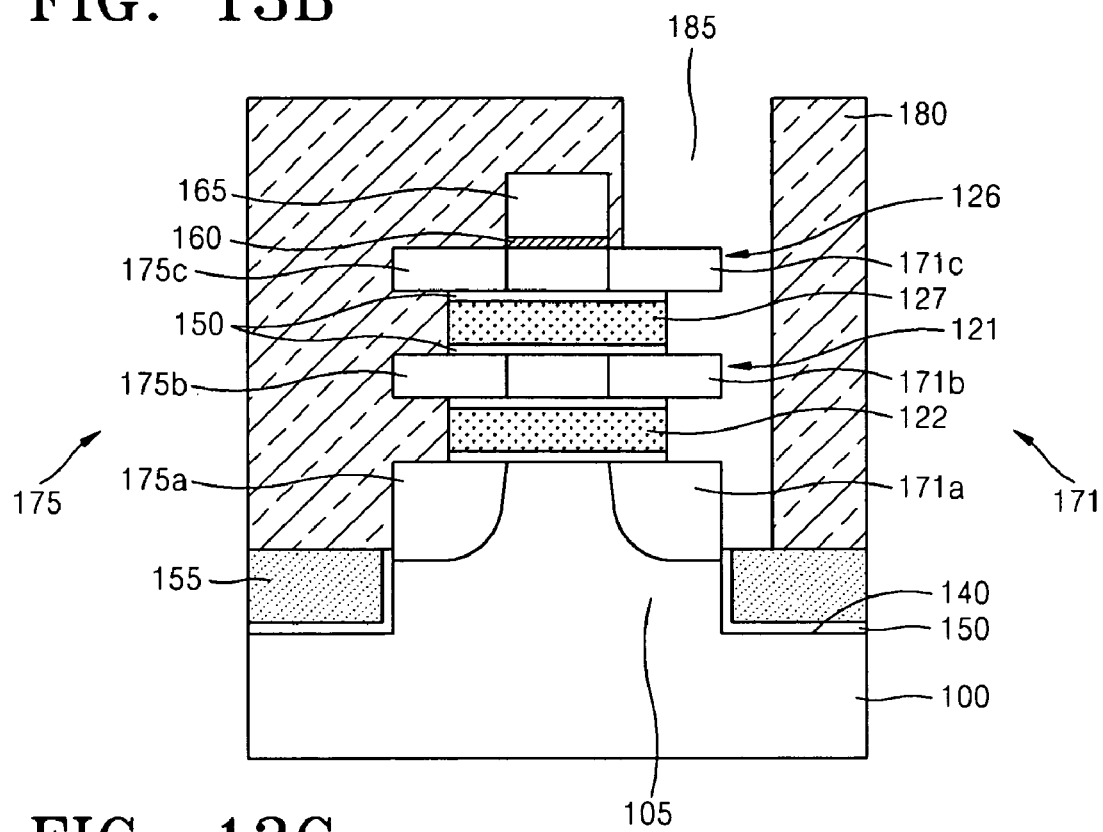
Figure 13C:
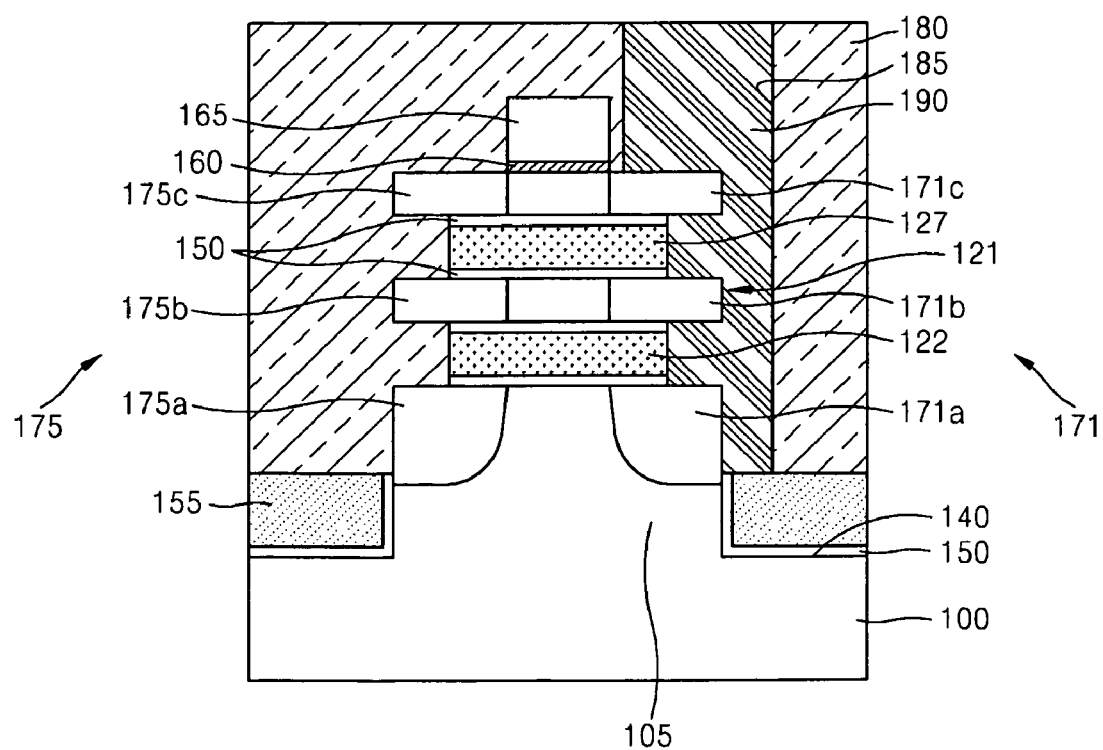
Figure 13D:
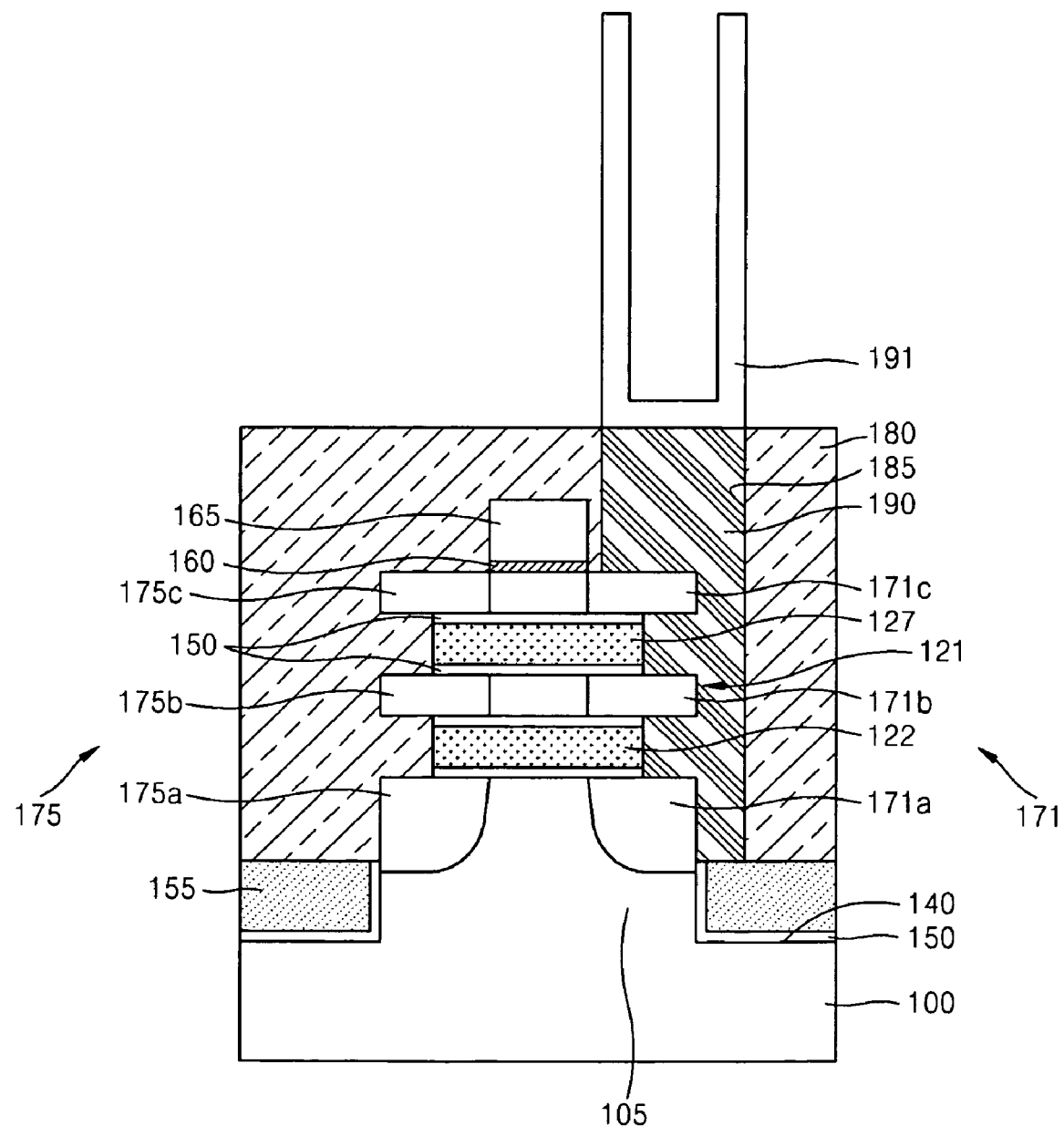
Figure 13E:
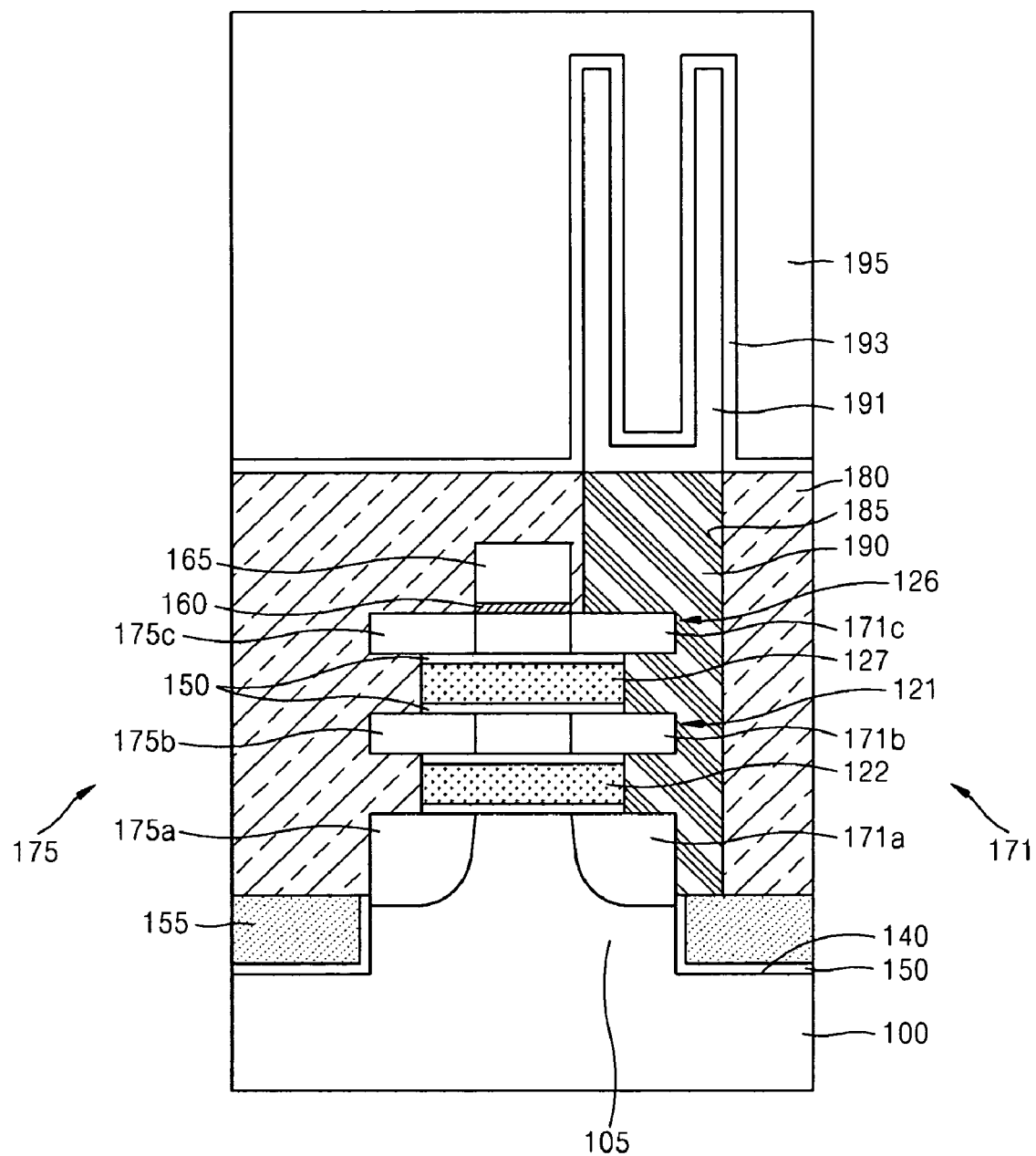

FIG. 13A is a perspective view of a semiconductor device according to example embodiments. FIGS. 13B through 13E are sectional views of the semiconductor memory device of FIG. 13A taken along the width direction of the gate, e.g., line IIC-IIC in FIG. 1. In FIGS. 13A through 13E, the semiconductor memory device may include a MOS transistor and a capacitor. The MOS transistor may have the same structure as the transistors in FIGS. 2A through 2C.

An interlayer insulation layer 180 is formed on the first insulation layer 155. The interlayer insulation layer 180 is etched to form a contact 185 that exposes portions of the semiconductor patterns 121 and 126 and the semiconductor fin 105. The impurity region 171a formed in the semiconductor fin 105, and the impurity regions 171b and 171c formed in the semiconductor patterns 121 and 126, respectively, may be fully exposed through the contact 185.

A conductive layer (not shown) is formed on the interlayer insulation layer 180 to fill the contact 185 and then subjected to a CMP process, thereby resulting in a conductive plug 190 that contacts the exposed portions of the impurity regions 171a, 171b and 171c in the contact 185. At least one barrier metal layer may be arranged between the conductive plug 190 and the impurity regions 171a, 171b and 171c. A storage electrode 191 is formed on the conductive plug 190. A capacitor dielectric layer 193 is formed on the storage electrode 191 and the interlayer insulation layer 180. A plate electrode 195 is formed on the capacitor dielectric layer 193.

While example embodiments have been particularly shown and described with reference to example embodiments thereof, it will be understood that various changes in form and details may be made therein without departing from the spirit and scope of the following claims.

What is claimed is:

1. A semiconductor device comprising:
a semiconductor substrate including a semiconductor fin configured to protrude from a surface of the semiconductor substrate in a first direction, the semiconductor fin having a first width extending in the first direction and a second width crossing the first width in a second direction;
a plurality of active patterns arranged in the first direction with a separation gap from the semiconductor fin;
a plurality of support patterns arranged between the semiconductor fin and one of the plurality of active patterns arranged closest to the semiconductor fin in the first direction, and between the plurality of active patterns arranged in the first direction to support the plurality of active patterns; and
a gate arranged to cross the plurality of active patterns in the second direction and to cover a portion of at least one of the plurality of active patterns,
wherein the plurality of support patterns are insulation patterns.

2. The semiconductor device of claim 1, wherein the plurality of active patterns are bar type semiconductor patterns that extend in the second direction and have a cross-section with rounded edges.

3. The semiconductor device of claim 2, wherein the plurality of active patterns are monocrystalline silicon patterns.

4. The semiconductor device of claim 1, wherein the plurality of support patterns are silicon-germanium-oxide layer patterns.

5. The semiconductor device of claim 1, further comprising:
an insulation layer arranged between the semiconductor fin and the plurality of support patterns, and between the plurality of support patterns and the plurality of active patterns.

6. The semiconductor device of claim 5, wherein the insulation layer is a thermal oxide layer.

7. The semiconductor device of claim 1, wherein the gate has an omega-like shape configured to cover either at least one of the plurality of active patterns or at least one of the plurality of active patterns and a portion of one of the plurality of support patterns that supports the plurality of active patterns in the second direction.

8. The semiconductor device of claim 7, further comprising:
source and drain regions arranged in portions of the at least one of the plurality of active patterns on both sides of the gate and exposed from the gate; and
a channel region arranged between the source and drain regions.

9. The semiconductor device of claim 8, wherein widths of the source and drain regions are substantially equal to a width of the channel region in the second direction.

10. The semiconductor device of claim 1, wherein the gate has a gate all around (GAA) structure configured to cover the plurality of active patterns, the plurality of support patterns supporting the plurality of active patterns, and a portion of the semiconductor fin.

11. The semiconductor device of claim 10, further comprising:
source and drain regions arranged in portions of the plurality of active patterns and the semiconductor fin that are on both sides of the gate and exposed from the gate; and
multiple channel regions arranged between the source and drain regions.

12. The semiconductor device of claim 11, wherein widths of the source and drain regions are substantially equal to widths of the multiple channel regions in the second direction.

13. The semiconductor device of claim 12, wherein the semiconductor substrate further includes a trench on the surface of the semiconductor substrate to define the semiconductor fin, further comprising:
a first insulation layer configured to fill a portion of the trench and exposes at least the exposed portion of the semiconductor fin;
a second insulation layer on the first insulation layer to cover the gate, the plurality of active patterns, the exposed portion of the semiconductor fin and the plurality of support patterns, the second insulation layer including a contact configured to expose portions of the plurality of active patterns and the semiconductor fin that include one of the source and drain regions;
a conductive plug configured to fill the contact and completely cover the exposed portions of the plurality of active patterns and the semiconductor fin; and
a storage electrode connected to the conductive plug.

14. The semiconductor device of claim 13, further comprising:
a capacitor dielectric layer on the storage electrode and the second insulation layer; and
a plate electrode on the capacitor dielectric layer.

15. The semiconductor device of claim 1, further comprising:
a gate insulation layer under the gate.

* * * * *

UNITED STATES PATENT AND TRADEMARK OFFICE
CERTIFICATE OF CORRECTION

PATENT NO. : 8,106,464 B2  Page 1 of 1
APPLICATION NO. : 12/461500
DATED : January 31, 2012
INVENTOR(S) : Keun-hwi Cho et al.

It is certified that error appears in the above-identified patent and that said Letters Patent is hereby corrected as shown below:

Title page, item [75] Inventors should read as follows:

"[75] Inventors: [[Keun-hwl]] Keun-hwi Cho, Seoul (KR); Dong-won"

Signed and Sealed this

Seventh Day of August, 2012

David J. Kappos
*Director of the United States Patent and Trademark Office*